United States Patent
Hekmatshoartabari et al.

(10) Patent No.: US 10,903,275 B2
(45) Date of Patent: Jan. 26, 2021

(54) THREE-DIMENSIONAL STACKABLE MULTI-LAYER CROSS-POINT MEMORY WITH SINGLE-CRYSTALLINE BIPOLAR JUNCTION TRANSISTOR SELECTORS

(71) Applicant: International Business Machines Corporation, Armonk, NY (US)

(72) Inventors: Bahman Hekmatshoartabari, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/429,979

(22) Filed: Jun. 3, 2019

(65) Prior Publication Data

US 2020/0381481 A1 Dec. 3, 2020

(51) Int. Cl.
*H01L 27/24* (2006.01)
*H01L 27/22* (2006.01)

(52) U.S. Cl.
CPC ........ *H01L 27/2481* (2013.01); *H01L 27/226* (2013.01); *H01L 27/2445* (2013.01)

(58) Field of Classification Search
CPC ............... H01L 27/2481; H01L 27/226; H01L 27/2445
See application file for complete search history.

(56) References Cited

U.S. PATENT DOCUMENTS

| 6,777,773 | B2 | 8/2004 | Knall |
| 8,623,697 | B2 | 1/2014 | Magistretti et al. |
| 8,988,926 | B2 | 3/2015 | Pellizzer et al. |
| 9,184,215 | B2 | 11/2015 | Tan et al. |
| 9,246,089 | B2 | 1/2016 | Herner et al. |
| 9,257,431 | B2 | 2/2016 | Ravasio et al. |
| 9,496,271 | B2 | 11/2016 | Or-Bach et al. |

(Continued)

FOREIGN PATENT DOCUMENTS

WO 2016085565 A1 6/2016

OTHER PUBLICATIONS

C.H. Wang et al., "Three-Dimensional 4F2 ReRAM Cell with CMOS Logic Compatible Process," IEEE International Electron Devices Meeting (IEDM), Dec. 6-8, 2010, 4 pages.

(Continued)

*Primary Examiner* — Sitaramarao S Yechuri
(74) *Attorney, Agent, or Firm* — L. Jeffrey Kelly; Ryan, Mason & Lewis, LLP

(57) ABSTRACT

A method for manufacturing a semiconductor memory device includes forming a plurality of doped semiconductor layers in a stacked configuration on a dielectric layer. The plurality of doped semiconductor layers each comprise a single crystalline semiconductor material. In the method, a memory stack layer is formed on an uppermost doped semiconductor layer of the plurality of doped semiconductor layers, and the memory stack layer and a plurality of doped semiconductor layers are patterned into a plurality of pillars spaced apart from each other. The patterned plurality of doped semiconductor layers in each pillar of the plurality of pillars are components of a bipolar junction transistor device, and the plurality of pillars are parts of a memory cell array having a cross-point structure.

20 Claims, 32 Drawing Sheets

(56) References Cited

U.S. PATENT DOCUMENTS

| | | | |
|---|---|---|---|
| 9,577,010 | B2 | 2/2017 | Sciarrillo |
| 9,871,076 | B2 | 1/2018 | Toh et al. |
| 10,011,920 | B2 | 7/2018 | Hekmatshoar-Tabari et al. |
| 2009/0014836 | A1 | 1/2009 | Lee et al. |
| 2011/0169126 | A1* | 7/2011 | Chen .................. H01L 45/06 257/528 |
| 2012/0145984 | A1 | 6/2012 | Rabkin et al. |
| 2012/0210932 | A1 | 8/2012 | Hekmatshoar-Tabari et al. |
| 2012/0289020 | A1 | 11/2012 | Kim et al. |
| 2012/0305879 | A1 | 12/2012 | Lu et al. |
| 2013/0126816 | A1 | 5/2013 | Tang et al. |
| 2013/0134383 | A1 | 5/2013 | Hwang et al. |
| 2013/0235654 | A1* | 9/2013 | Rigano ............... H01L 27/2436 365/163 |
| 2013/0270501 | A1 | 10/2013 | Toh et al. |
| 2014/0284540 | A1 | 9/2014 | Suguro |
| 2015/0070965 | A1 | 3/2015 | Bandyopadhyay et al. |
| 2015/0137061 | A1 | 5/2015 | Donghi et al. |
| 2017/0092748 | A1 | 3/2017 | Ting et al. |
| 2017/0148852 | A1* | 5/2017 | Boniardi ............ H01L 27/2481 |
| 2017/0317139 | A1* | 11/2017 | Seong ................. H01L 27/2427 |
| 2017/0365642 | A1* | 12/2017 | Ravasio ............. H01L 45/1233 |
| 2018/0047707 | A1 | 2/2018 | Or-Bach et al. |
| 2018/0277521 | A1 | 9/2018 | Or-Bach et al. |
| 2019/0019947 | A1* | 1/2019 | Gotti .................. H01L 45/1675 |

OTHER PUBLICATIONS

X.P. Wang et al., "Highly Compact 1T-1R Architecture (4F2 Footprint) Involving Fully CMOS Compatible Vertical GAA Nano-Pillar Transistors and Oxide-Based RRAM Cells Exhibiting Excellent NVM Properties and Ultra-Low Power Operation," IEEE International Electron Devices Meeting (IEDM), Dec. 10-13, 2012, 4 pages.

H. Wu et al., "RRAM Cross-Point Arrays," 3D Flash Memories, Chapter 8, May 2016, pp. 223-260.

S. Shahrjerdi et al., "Low-Temperature Epitaxy of Compressively Strained Silicon Directly on Silicon Substrates," Journal of Electronic Materials, Mar. 2012, pp. 494-497, vol. 41, No. 3.

Y. Kim et al., "Three-Dimensional NAND Flash Architecture Design Based on Single-Crystalline STacked ARray," IEEE Transactions on Electron Devices, Jan. 2012, pp. 35-45, vol. 59, No. 1.

J.H. Oh et al., "Full Integration of Highly Manufacturable 512Mb PRAM Based on 90nm Technology," International Electron Devices Meeting (IEDM), Dec. 11-13, 2006, 4 pages.

J. Cai et al., "On the Device Design and Drive-Current Capability of SOI Lateral Bipolar Transistors," IEEE Journal of the Electron Devices Society, Sep. 2014, pp. 105-113, vol. 2, No. 5.

V.S.S. Srinivasan, et al., "Punchthrough-Diode-Based Bipolar RRAM Selector by Si Epitaxy", IEEE Electric Device Letters, Oct. 2012, vol. 33, No. 10.

M.H. Lee, et al., "Reliability of Ambipolar Switching Poly-Si Diodes for Cross-Point Memory Applications", Device Research Conference (DRC) 2011, 69th Annual.

S.H. Jo, et al., "CMOS Compatible Nanoscale Nonvolatile Resistance Switching Memory", Nano Letters, Feb. 2008, pp. 392-397, vol. 8, No. 2.

Y. Dong, et al., "Si/a-Si Core/Shell Nanowires as Nonvolatile Crossbar Switches", Nano Letters, Feb. 2008, pp. 386-391, vol. 8, No. 2.

Wikipedia, "3D XPoint," https://en.wikipedia.org/wiki/3D_XPoint, 2017, 3 pages.

Crossbar, "Crossbar ReRAM: Rethinking Simplicity.," https://www.crossbar-inc.com/en/technology/reram-overview/, 4 Pages.

G.W. Burr et al., "Access Devices for 3D Crosspoint Memory.," Journal of Vacuum Science & Technology B, Nanotechonology and Microelectronics: Materials, Processing, Measurement, and Phenomena, Jul./Aug. 2014, vol. 32, No. 4, 23 pages.

K. Suga et al., "P-3: The Effect of a Laser Annealing Ambient on the Morphology and TFT Performance of Poly-Si Films," Society for Information Display, vol. 31, No. 1, May 2000, pp. 534-537.

R. F. Wood et al., "Macroscopic Theory of Pulsed-Laser Annealing II. Dopant Diffusion and Segregation," The American Physical Society, vol. 23, No. 10, May 15, 1981, pp. 5555-5569.

K. Oh et al., "Bottom-Gate ELA Poly-Si TFT for High-Resolution AMOLED Mobile Displays," Society for Information Display, vol. 47, No. 1, May 22, 2016, pp. 923-926.

Y. Chen et al., "P-4: Fabrication of Extremely Low Roughness Polycrystalline Silicon and Its Correlation to Device Performance," Society for Information Display, vol. 34, No. 1, May 2003, pp. 216-219.

D. Shahrjerdi et al., "Low-Temperature Epitaxy of Compressively Strained Silicon Directly on Silicon Substrates," Journal of Electronic Materials, vol. 41, No. 3, 2012, pp. 494-497.

F. Carta et al., "Sequential Lateral Solidification of Silicon Thin Films on Cu BEOL-Integrated Wafers for Monolithic 3-D Integration," IEEE Transactions on Electron Devices, vol. 62, No. 11, Nov. 2015, pp. 3887-3891.

M. Johnson et al., "512-Mb PROM with a Three-Dimensional Array of Diode/Antifuse Memory Cells," IEEE Journal of Solid-State Circuits, Nov. 2003, pp. 1920-1928, vol. 38, No. 11.

M. Crowley et al., "512Mb PROM with 8 Layers of Antifuse/Diode Cells," IEEE International Solid-State Circuits Conference (ISSCC), Paper 16.4, Feb. 13, 2003, 10 pages.

U.S. Appl. No. 16/292,894 filed in the name of Alexander Reznicek et al. on Mar. 5, 2019 and entitled "Resistive Memory with Amorphous Silicon Filaments."

U.S. Appl. No. 15/845,830 filed in the name of Alexander Reznicek et al. on Dec. 18, 2017 and entitled "Resistive Memory with Amorphous Silicon Filaments."

List of IBM Patents or Patent Applications Treated as Related.

* cited by examiner

A-A/B-B

A-A/B-B

A-A

B-B

A-A

A-A

B-B

A-A

B-B

THREE-DIMENSIONAL STACKABLE MULTI-LAYER CROSS-POINT MEMORY WITH SINGLE-CRYSTALLINE BIPOLAR JUNCTION TRANSISTOR SELECTORS

BACKGROUND

Memory cells may include, for example, phase-change random-access memory (PCRAM), resistive random-access memory (RRAM or ReRAM), magnetic random-access memory (MRAM), and/or fuse/anti-fuse devices. Memory devices, such as, for example, RRAM devices, can be stacked in a three-dimensional (3D) configuration. Commercially available 3D memory devices include Crossbar™ ReRAM, from Crossbar, Inc. of Santa Clara, Calif., and 3D XPoint™, from Intel Corporation of Santa Clara, Calif. Storage in the 3D memory devices may be based on resistance changes in a stackable cross-gridded data access array.

A "cross-point" structure includes a configuration of memory cells at the intersection of wordlines and bitlines. Current density required for programming memory elements increases as the density of a cross-point memory array increases. This poses demanding requirements on the quality of the semiconductor material used for implementing selector devices. Single-crystalline materials have the relatively highest quality, but are not compatible with 3D stacking. Cross-point memory arrays with p-n junction selector devices have been demonstrated. The maximum current density that can be provided with bipolar transistors is of the same order as p-n junction diodes, but bipolar transistors enable better control of current given the additional base electrode when compared with p-n junction diodes. Bipolar transistors also permit formation of a current source with current compliance (with current saturating at a desired level). Particularly for enabling multi-state memory levels, bipolar transistors are much more suitable than p-n junction diodes.

SUMMARY

According to an exemplary embodiment of the present invention, a method for manufacturing a semiconductor memory device includes forming a plurality of doped semiconductor layers in a stacked configuration on a dielectric layer. The plurality of doped semiconductor layers each comprise a single crystalline semiconductor material. In the method, a memory stack layer is formed on an uppermost doped semiconductor layer of the plurality of doped semiconductor layers, and the memory stack layer and a plurality of doped semiconductor layers are patterned into a plurality of pillars spaced apart from each other. The patterned plurality of doped semiconductor layers in each pillar of the plurality of pillars are components of a bipolar junction transistor device, and the plurality of pillars are parts of a memory cell array having a cross-point structure.

According to an exemplary embodiment of the present invention, a semiconductor device includes a plurality of stacked structures spaced apart from each other and formed on a common select line or a plurality of select lines. Each of the plurality of stacked structures comprises a first single crystalline semiconductor layer on the common select line or a select line of the plurality of select lines, a second single crystalline semiconductor layer stacked on the first single crystalline semiconductor layer, a third single semiconductor crystalline layer stacked on the second single crystalline semiconductor layer, and a memory element stacked on the third single crystalline semiconductor layer. The first, second and third single crystalline semiconductor layers in each stacked structure of the plurality of stacked structures are components of a bipolar junction transistor device, and the plurality of stacked structures are parts of a memory cell array having a cross-point structure.

According to an exemplary embodiment of the present invention, a method for manufacturing a semiconductor device includes forming a plurality of doped semiconductor layers in a stacked configuration on a dielectric layer. The plurality of doped semiconductor layers each comprise a single crystalline semiconductor material. In the method, a memory stack layer is formed on an uppermost doped semiconductor layer of the plurality of doped semiconductor layers, and the memory stack layer and a plurality of doped semiconductor layers are patterned into a plurality of pillars spaced apart from each other. The patterned plurality of doped semiconductor layers in each pillar of the plurality of pillars comprise respective emitter, base and collector layers of a selector device. The method also includes growing a plurality of extrinsic base layers from the base layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
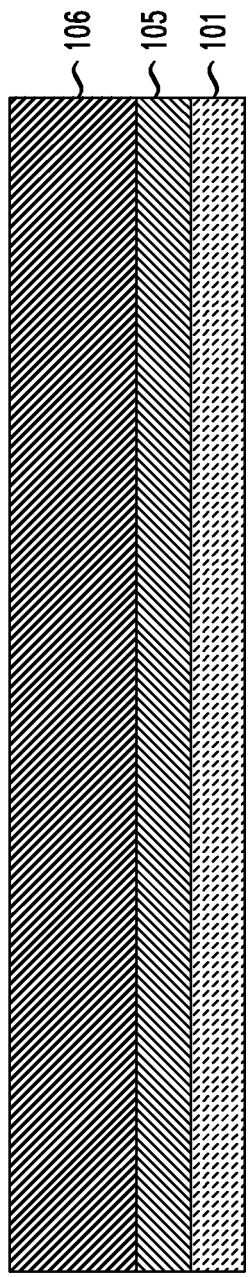
FIG. 1 is a schematic cross-sectional view illustrating manufacturing of a memory device and showing an emitter layer on a dielectric layer, according to an embodiment of the invention.

Exemplary embodiments of the invention will now be discussed in further detail with regard to semiconductor devices and methods of manufacturing same and, in particular, to forming 3D cross-point memory arrays comprised of single-crystalline bipolar junction transistor (BJT) selector devices.

It is to be understood that the various layers and/or regions shown in the accompanying drawings are not drawn to scale, and that one or more layers and/or regions of a type commonly used in, for example, random-access memory (RAM), phase-change random-access memory (PCRAM), resistive random-access memory (RRAM or ReRAM), three-dimensional (3D) RRAM, magnetic random-access memory (MRAIVI), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, RAM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to RAM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use RAM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Memory devices, (e.g., RAM, RRAM devices) according to one or more embodiments, are stacked in a 3D cross-point configuration. As noted above, a "cross-point" structure includes a configuration of memory cells at the intersection of wordlines and bitlines. In the structure, each of the memory cells can be addressed individually, so that data can be written and read in small sizes. As used herein, a "3D cross-point" structure includes two or more stacked layers of cross-point/crossbar memory structures. Storage in RRAM devices is based on resistance changes in a stackable cross-gridded data access array.

One or more embodiments relate to methods and structures to form 3D cross-point memory arrays with single-crystalline BJT selector devices. In accordance with an embodiment, device structures fabricated on silicon-on-insulator (SOI) substrates are stacked and bonded. Given the relatively higher quality of single-crystalline semiconductors compared to poly-crystalline semiconductors, the embodiments enable higher current densities than conventional structures.

As known in the art, the designation of collector and emitter terminals in bipolar transistors (e.g., BJTs) depends on the polarities of the operation voltages applied to the transistors. As such, in the exemplary embodiments described below, the designation of collector and emitter regions are interchangeable, and the transistor terminal connected to the memory element may function either as the emitter or as the collector of the transistor depending on the voltage polarity used during a certain operation.

Referring to FIG. 1, a dielectric layer 105, such as, for example, a buried oxide (BOX) layer or buried nitride layer, is formed on a semiconductor carrier substrate 101. The carrier substrate 101 includes a semiconductor material including, but not necessarily limited to, silicon (Si), silicon germanium (SiGe), Si:C (carbon doped silicon), carbon doped silicon germanium (SiGe:C), III-V, II-V compound semiconductor or other like semiconductor. In addition, multiple layers of the semiconductor materials can be used as the semiconductor material of the substrate. The material of the dielectric layer 105 can include, but is not necessarily limited to, a low-K dielectric material, such as, for example, silicon oxide, silicon nitride (SiN), silicon oxynitride (SiON), boron nitride (BN), and/or silicon boron nitride (SiBN).

An emitter/select line layer 106 is formed on the dielectric layer 105. According to an embodiment the emitter/select line layer 106 comprises n+ doped silicon, and is doped with, for example, arsenic (As) or phosphorus (P) at a total concentration in the general range of $10^{20}/cm^3$ $10^{21}/cm^3$. As explained herein below, stacked n+-p-n+ structures of emitters, bases and collectors are formed. Alternatively, a p+-n-p+ structure is formed, where the emitter/select line layer 106 is p+ doped, and is doped with, for example, boron (B) at a total (i.e. active and/or inactive) concentration in the general range of $10^{20}/cm^3$-$10^{21}/cm^3$. Layers which are n+ or p+ doped are referred to as highly doped, and layers which are n or p doped are referred to as moderately doped.

According to an embodiment, processing starts with a doped SOI layer formed on the dielectric layer 105 as the emitter/select line layer 106. Alternatively, processing starts with an undoped SOI layer formed on the dielectric layer 105, followed by doping the SOI layer, using techniques such as ion implantation and dopant activation anneal to form a doped emitter/select line layer 106. The doped or undoped SOI layer may be prepared using techniques known in the art, such as Smart Cut® treatments. In some embodiments, the combination of the SOI layer, the dielectric layer 105 (e.g., BOX), and the carrier substrate 101 is a commercially available SOI wafer which is used as a starting substrate for processing. In embodiments where the starting SOI layer (e.g., of a commercially available SOI wafer) is not of desired thickness, the thickness of the SOI layer can be adjusted using known techniques, e.g. reduced by chemical-mechanical polishing (CMP) or increased by epitaxial growth. A thickness (e.g., height with respect to the underlying layer) of the emitter/select line layer 106 can be approximately 5 nm-25 nm, but thinner or thicker layers may be used as well.

Figure 2:
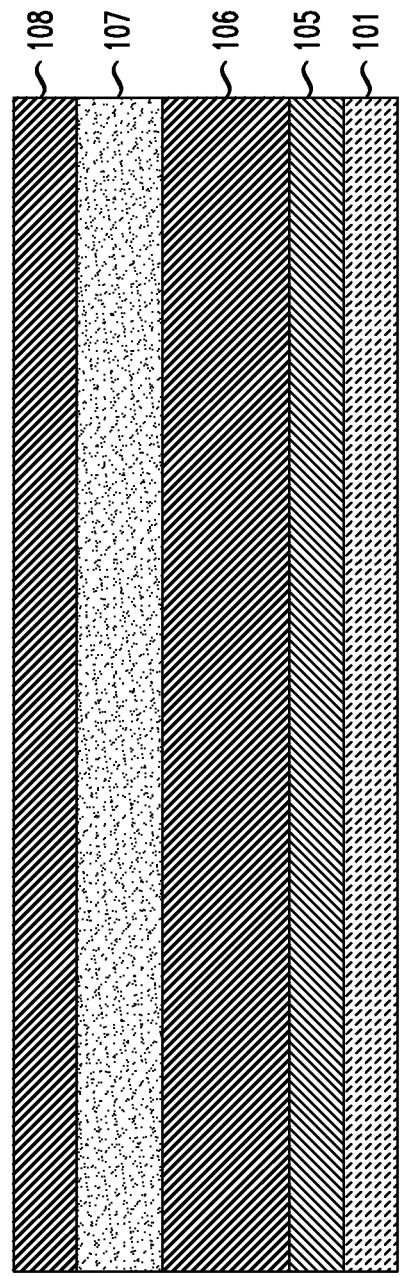
FIG. 2 is a schematic cross-sectional view illustrating manufacturing of a memory device and showing formation of base and collector layers on the emitter layer, according to an embodiment of the invention.

Referring to FIG. 2, base and collector layers 107 and 108 are formed on the emitter/select line layer 106. According to an embodiment, either or both the emitter/select line and collector layers 106 and 108 have a bandgap wider than that of the base layer 107. According to an embodiment, the emitter/select line, base and collector layers 106, 107 and 108 comprise n+ doped silicon, p doped silicon germanium (SiGe) and n+ doped silicon, respectively. According to an embodiment, stacked n+-p-n+ structures of emitters, bases and collectors are formed when the emitter/select line, base and collector layers 106, 107 and 108 are patterned. Alternatively, if the doping scheme is changed, stacked p+–n–p+ structures of emitters, bases and collectors are formed.

In accordance with an embodiment, p doped SiGe and n+ doped silicon base and collector layers 107 and 108 are grown epitaxially using techniques known in the art, including various types of chemical vapor deposition (CVD) and molecular beam epitaxy (MBE). The epitaxial growth of a lightly-doped layer is performed using the same techniques described with respect to a moderately doped layer 107.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material).

The epitaxial deposition process may employ the deposition chamber of a CVD apparatus. The CVD apparatus may include, but is not limited to a rapid thermal CVD (RTCVD), a low-pressure CVD (LPCVD) or a metal-organic CVD (MOCVD) apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. By "in-situ", it is meant that the dopant that dictates the conductivity type of the doped layer is introduced during the process step, e.g., epitaxial deposition, that forms the doped layer. Dopant gases used for n-type doping may include, e.g., phosphine ($PH_3$) and arsine ($AsH_3$), and the dopant gases used for p-type doping may include, e.g., diborane ($B_2H_6$) or Trimethylborane ($B(CH_3)_3$, also known as TMB). In some embodiments, the dopants may be introduced after epitaxial growth (i.e., ex-situ), for example, by ion-implantation.

In accordance with an embodiment of the present invention, the layer 107 is p doped, and is doped with, for example, boron (B) at a concentration in the general range of $5\times10^{18}/cm^3$-$5\times10^{19}/cm^3$, and the layer 108 is n+ doped, and is doped with, for example, arsenic (As) or phosphorous (P) at a concentration in the general range of $10^{20}/cm^3$-$10^{21}/cm^3$. As explained herein, a stacked $n^+p$-$n^+$ structure is formed. Alternatively, a $p^+$-n-$p^+$ structure is formed, where the layer 107 is n doped, and the layer 108 is $p^+$ doped. A thickness (e.g., height with respect to the underlying layer) of the layers 107 and 108 can be approximately 3 nm-approximately 15 nm, but thicker or thinner layers may be used as well.

Instead of polycrystalline semiconductors, the emitter/select line, base and collector layers 106, 107 and 108 comprise single-crystalline semiconductors to form single-crystalline BJT selector devices. Unlike polycrystalline materials, in single-crystalline materials, the crystal lattice of the entire sample is continuous and unbroken to the edges of the sample, with no grain boundaries, resulting in higher quality semiconductors, and increased current density.

Figure 3:
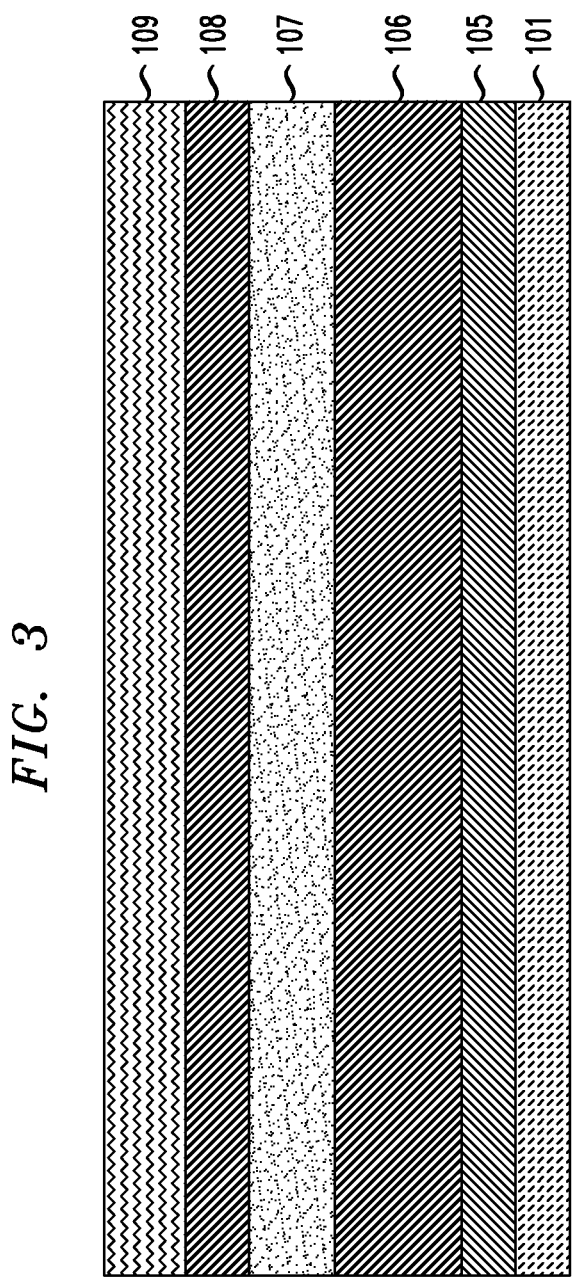
FIG. 3 is a schematic cross-sectional view illustrating manufacturing of a memory device and showing formation of a memory stack on the collector layer, according to an embodiment of the invention.

Referring to FIG. 3, a memory stack 109 is formed on the collector layer 108. According to one or more embodiments, the memory stack can comprise memory devices, such as, but not necessarily limited to, PCRAM, MRAM, RRAM (or ReRAM), and/or magnetic tunnel junction (MTJ) devices.

Figure 4:
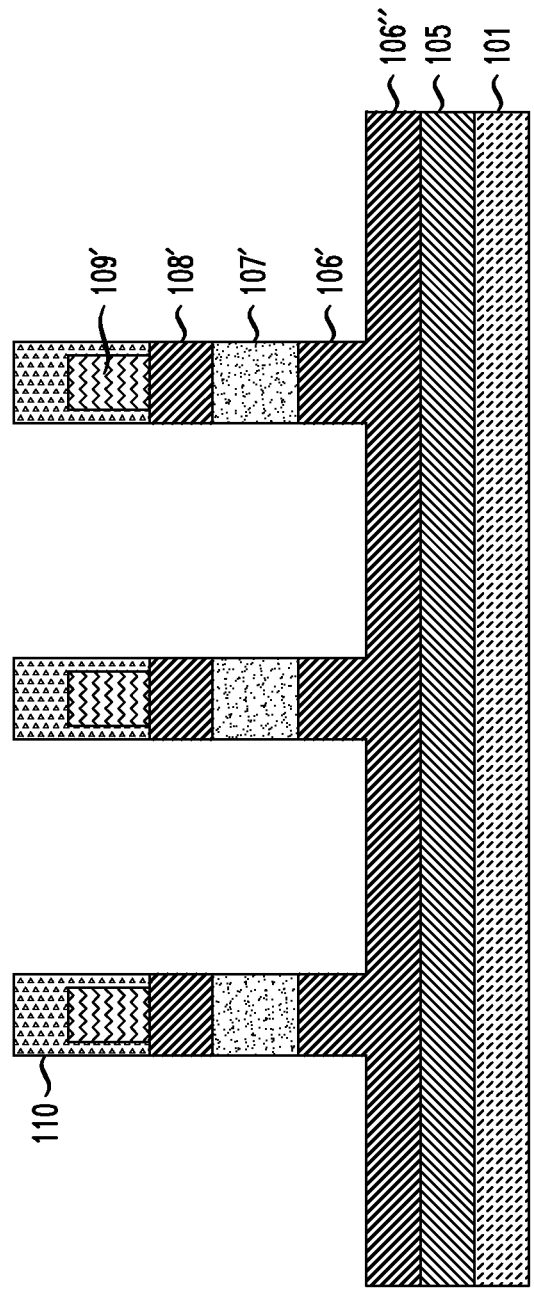
FIG. 4 is a schematic cross-sectional view taken along the line A-A or the line B-B in FIG. 5 illustrating manufacturing of a memory device and showing patterning of memory stack, collector, base and emitter layers, according to an embodiment of the invention.
Figure 5:
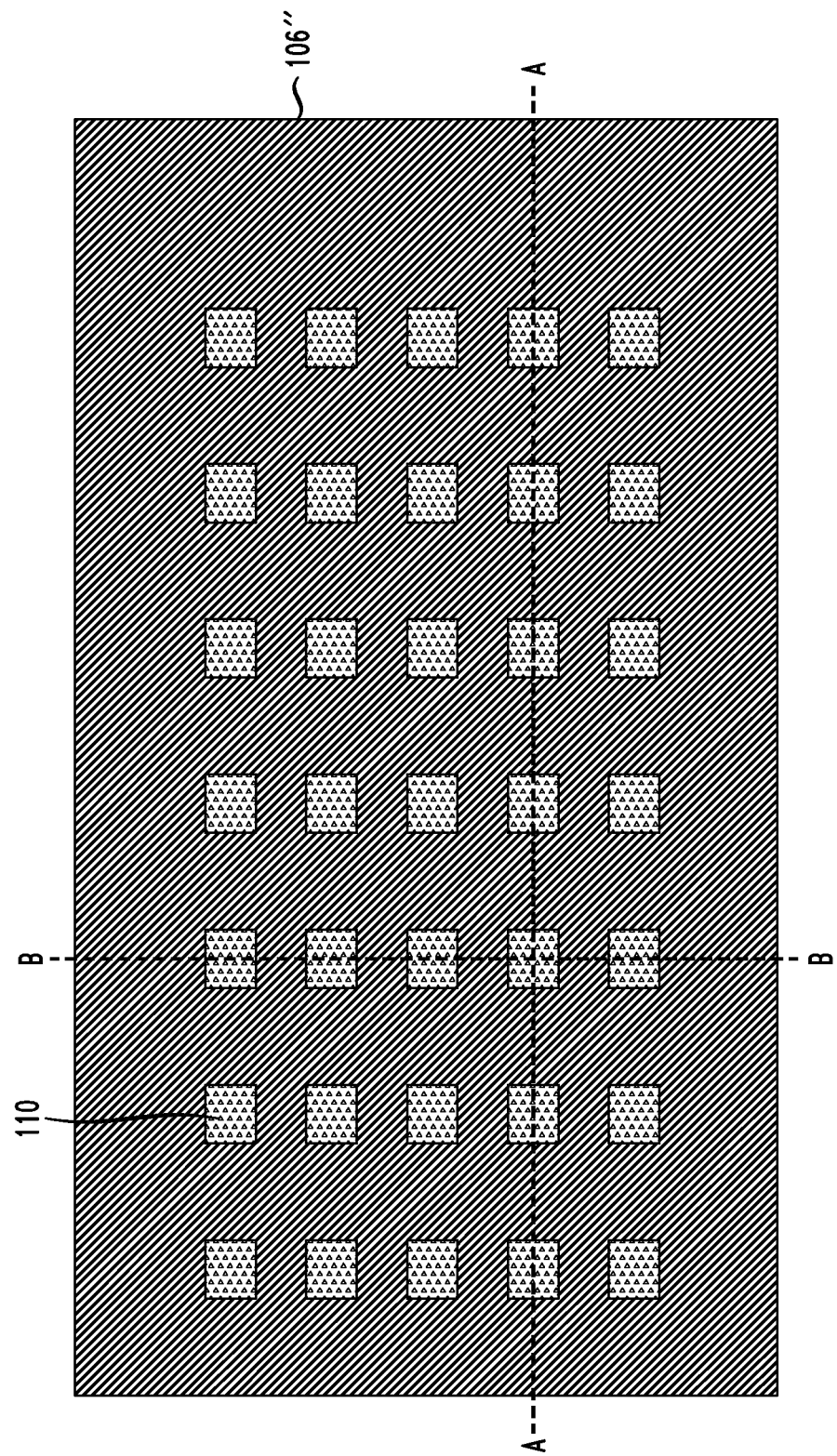
FIG. 5 is a schematic top view illustrating manufacturing of a memory device and showing patterning of memory stack, collector, base and emitter layers, according to an embodiment of the invention.

FIG. 4 is a schematic cross-sectional view taken along either the line A-A or the line B-B in the top view of FIG. 5. Referring to FIGS. 4 and 5, memory stack, collector, base and emitter/select line layers 109, 108, 107 and 106 are patterned into stacked structures (referred to herein as "pillars"), which are spaced apart from each other. The patterned portions of the memory stack, collector, base and emitter/select line layers in each pillar are a memory element 109', a collector 108', a base 107' and an emitter 106', respectively. The pillars are on a remaining unpatterned portion of the emitter/select line, which is a common select line 106".

According to a non-limiting embodiment, the memory stack layer 109 is patterned to form memory elements 109'. The memory stack layer 109 is patterned into the memory elements by, for example, an etching process, wherein portions of the memory stack layer 109 are masked, and exposed portions are removed by etching. The remaining memory elements have a lateral width that is less than that of the underlying layers 106', 107' and 108' forming the BJTs. Following patterning to form the memory elements 109', the masks used for patterning the memory stack layer 109 are removed, and cap layers 110 are deposited to encapsulate the memory elements 109', covering the memory elements 109' on top and side surfaces. The cap layers 110 are planarized with a planarization process, such as, for example, chemical mechanical polishing (CMP). The cap layers 110 include, for example, SiN, SiON, BN or SiBN. Using the cap layers 110 as masks, the exposed portions of the layers 106, 107 and 108 are removed using, for example, a reactive ion etching (ME) process including, such as $SF_6/O_2$ plasma, $SF_6/CHF_3$ plasma, $SF_6/CCl_2F_2$ or $CF_4$ plasma to form the BJT portions of the pillars comprising the emitter, base and collector layers 106', 107' and 108'. The etching is performed down to a specified depth of the emitter/select line layer 106, so that part of the layer 106 is formed into the emitter layers 106' of the pillars, and a remaining part of the layer formed the common select line 106". Alternatively, a selective etch is used and the pillar etch stops on the emitter/select line layer 106, so that the layer 106 is not etched (not shown). In some embodiments, the etching of the emitter/select line 106 is performed down to the dielectric layer 105, forming a plurality of select lines (not shown) instead of a common select line 106". In the case of a plurality of select lines, a plurality of pillars would each include a patterned emitter/select line layer completely patterned down to the dielectric layer, with an upper portion of the patterned emitter/select line layer in each pillar functioning as an emitter and a lower portion the patterned emitter/select line layer in each pillar functioning as a select line.

As noted above, stacked n+-p-n+ structures of emitters, bases and collectors 106', 107' and 108', respectively, are formed. Alternatively, stacked p+-n-p+ structures of emitters, bases and collectors 106', 107' and 108', respectively, are formed. Although FIG. 4 shows three pillars for ease of explanation, as can be seen in FIG. 5, a plurality of pillars are formed.

Figure 6:
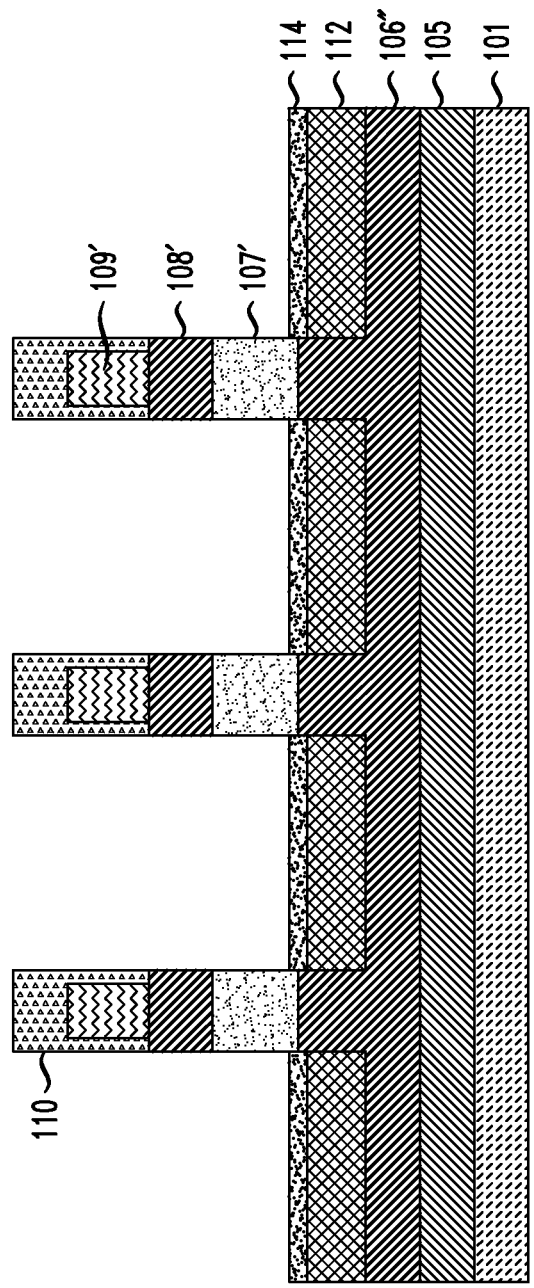
FIG. 6 is a schematic cross-sectional view taken along the line A-A or the line B-B in FIG. 7 illustrating manufacturing of a memory device and showing formation of dielectric and spacer layers, according to an embodiment of the invention.
Figure 7:
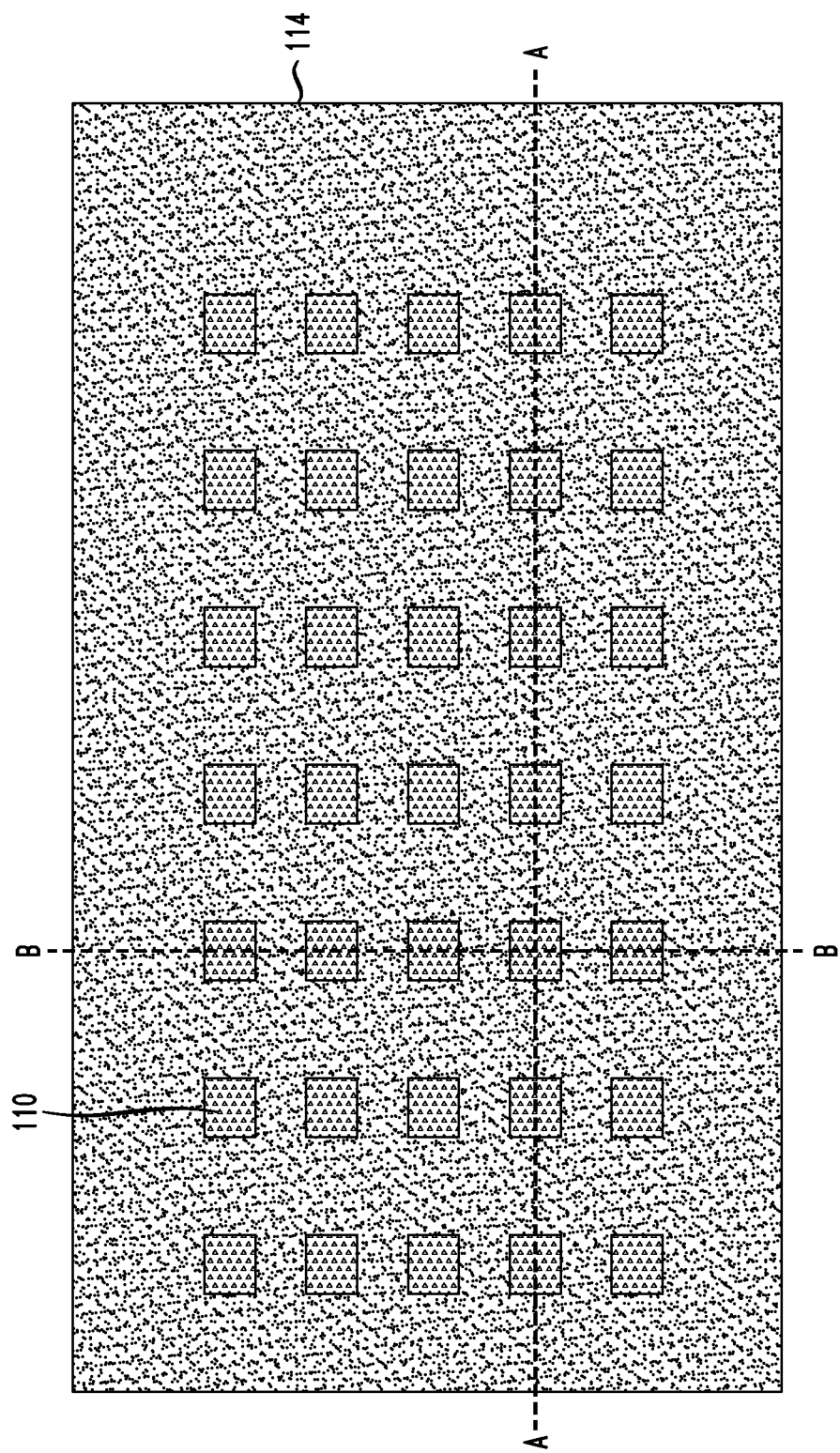
FIG. 7 is a schematic top view illustrating manufacturing of a memory device and showing formation of dielectric and spacer layers, according to an embodiment of the invention.

FIG. 6 is a schematic cross-sectional view taken along either the line A-A or the line B-B in the top view of FIG. 7. Referring to FIGS. 6 and 7, dielectric and spacer layers are formed on the common select line layer 106'' adjacent bottom portions of the pillars. More specifically, a dielectric layer 112, such as, for example, an oxide, is formed on the common select line layer 106'' in the spaces between the patterned pillars including the layers 106', 107', 108' and 109'. The material of the dielectric layer 112 can include, but is not necessarily limited to, a low-K dielectric material, such as, for example, silicon oxide. The dielectric layer 112 can be deposited using deposition techniques such as, for example, CVD, PECVD, RFCVD, PVD, ALD, MBD, PLD, and/or LSMCD, and/or sputtering, which may be followed by etching, such as ME, to recess the deposited dielectric layer 112 to a desired height. Alternatively, a flowable oxide can be deposited to the desired height of the dielectric layer 112 using, for example, CVD.

A thickness (e.g., height with respect to the underlying layer) of the layer 112 can be approximately 5 nm-approximately 20 nm, but thicker or thinner layers may be used as well.

Following deposition of the dielectric layer 112, a spacer layer 114 comprising, for example, a nitride, such as, but not necessarily limited to, silicon oxycarbonitride (SiOCN) or silicon boron carbonitride (SiBCN) is deposited on the dielectric layer 112. The spacer layer 114 can be deposited using deposition techniques such as, for example, CVD, PECVD, RFCVD, PVD, ALD, MBD, PLD, and/or LSMCD, and/or sputtering, and a thickness (e.g., height with respect to the underlying layer) of the layer 114 can be approximately 5 nm-approximately 15 nm, but thicker or thinner layers may be used as well. According to an embodiment, the spacer layer 114 overlaps junctions between the emitter and base layers 106' and 107' (e.g., n+-p junction).

Figure 8:
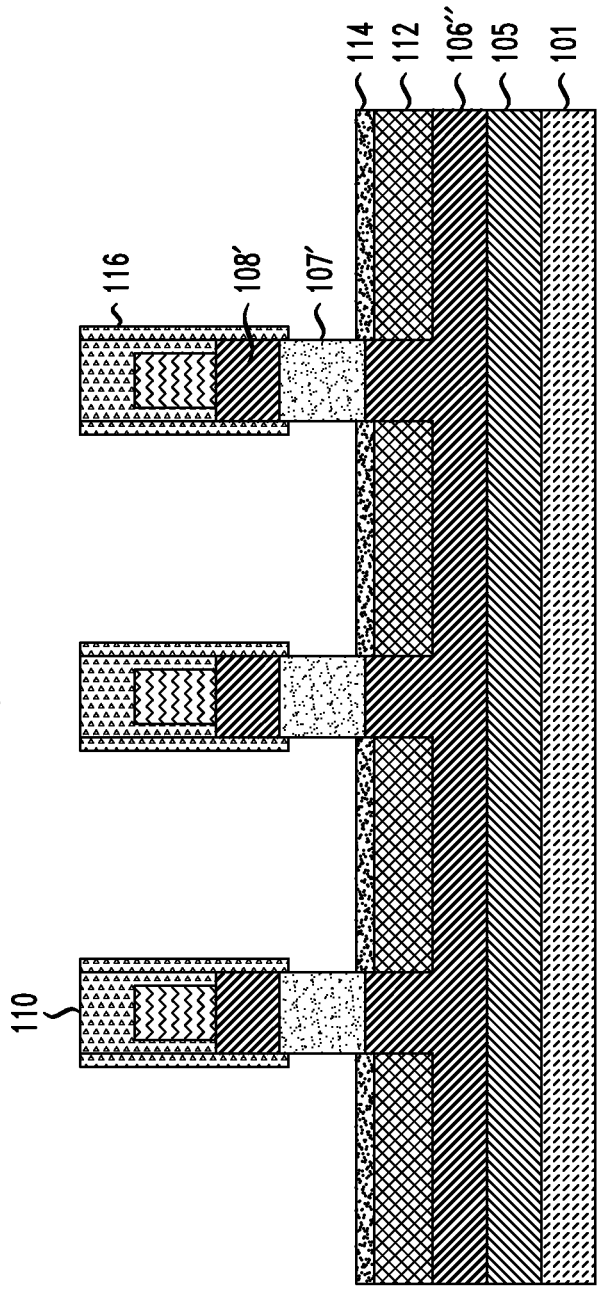
FIG. 8 is a schematic cross-sectional view taken along the line A-A or the line B-B in FIG. 9 illustrating manufacturing of a memory device and showing formation of hanging spacers, according to an embodiment of the invention.
Figure 9:
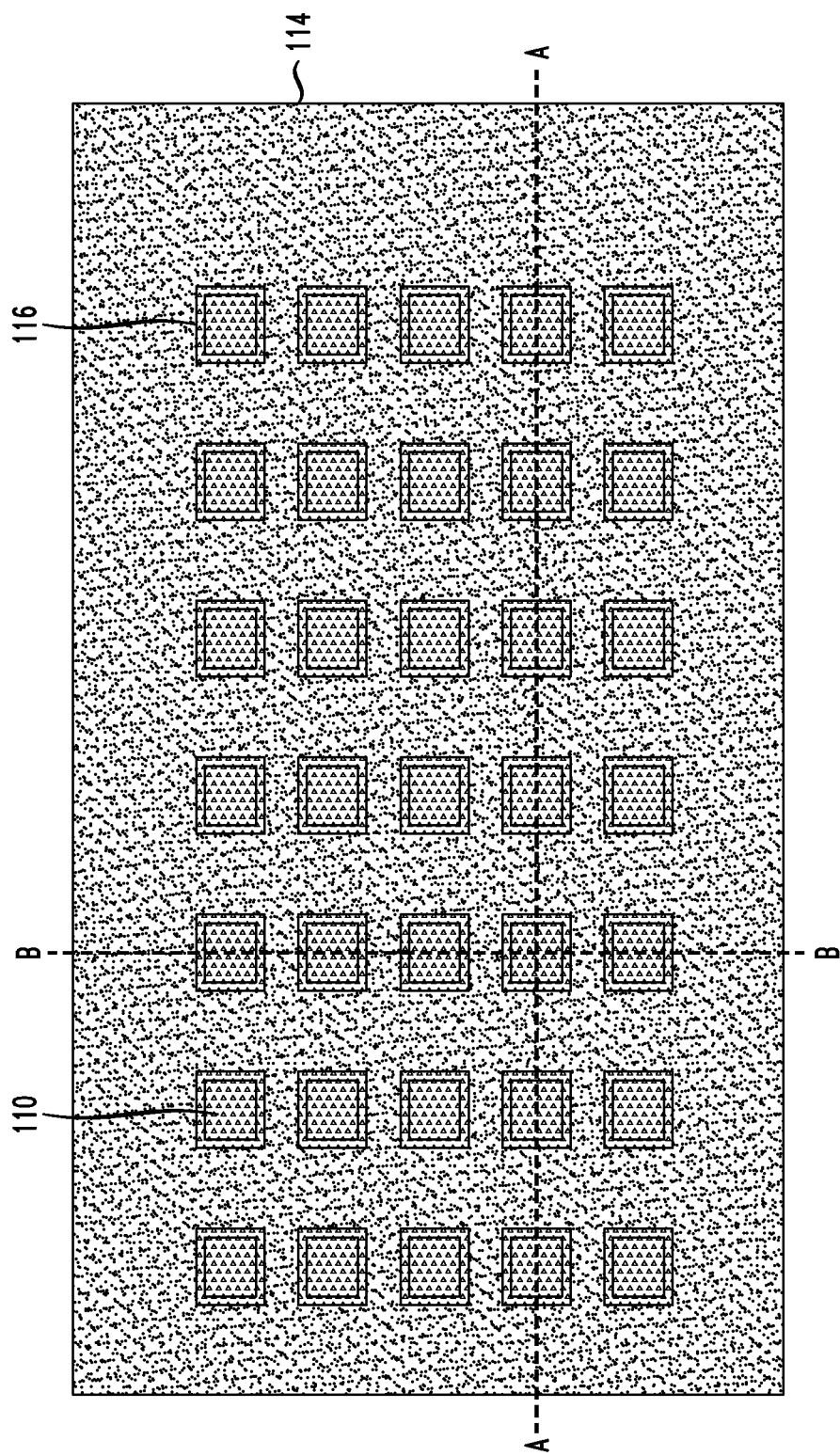
FIG. 9 is a schematic top view illustrating manufacturing of a memory device and showing formation of hanging spacers, according to an embodiment of the invention.

FIG. 8 is a schematic cross-sectional view taken along either the line A-A or the line B-B in the top view of FIG. 9. Referring to FIGS. 8 and 9, hanging spacers 116 are formed on sides of the patterned pillars including the cap layers 110 thereon. The spacers 116 are referred to herein as "hanging" because they do not extend all the way down to the spacer layer 114, and appear to be suspended from top surfaces of the cap layers 110. The hanging spacers 116 are formed on and cover the sides of the cap layers 110 and the collector layers 108'. The hanging spacers 116 also extend down to and are formed on part (e.g., upper part) of the sides of the base layer 107'. The hanging spacers 116 can be formed using a variety of techniques. According to an embodiment, the hanging spacers 116 are formed by depositing a sacrificial insulating layer (not shown) on the spacer layer 114, recessing the sacrificial insulating layer to a height where the hanging spacers are to end (e.g., at an upper portion of the base layer 108' as in FIG. 8), depositing the material of the hanging spacers 116 by conformal deposition (e.g., ALD or CVD), performing an isotropic etch to remove horizontal portions of the deposited spacer material to form the hanging spacers 116, and selectively removing (e.g., etching or stripping) the sacrificial insulating layer. The material of the hanging spacers 116 includes, but is not necessarily limited to, silicon oxide, SiN, SiON, BN, and/or SiBN. As can be understood from FIGS. 8 and 9, the hanging spacers 116 surround the cap layers 110, the collector layers 108' and the portions of the base layers 107' on all lateral sides. A thickness of the hanging spacers 116 with respect to the layers 110, 108' and 107' on which they are formed is about 5 nm-about 10 nm. According to an embodiment, the hanging spacers 116 may comprise the same or similar material as the cap layers 110.

Figure 10:
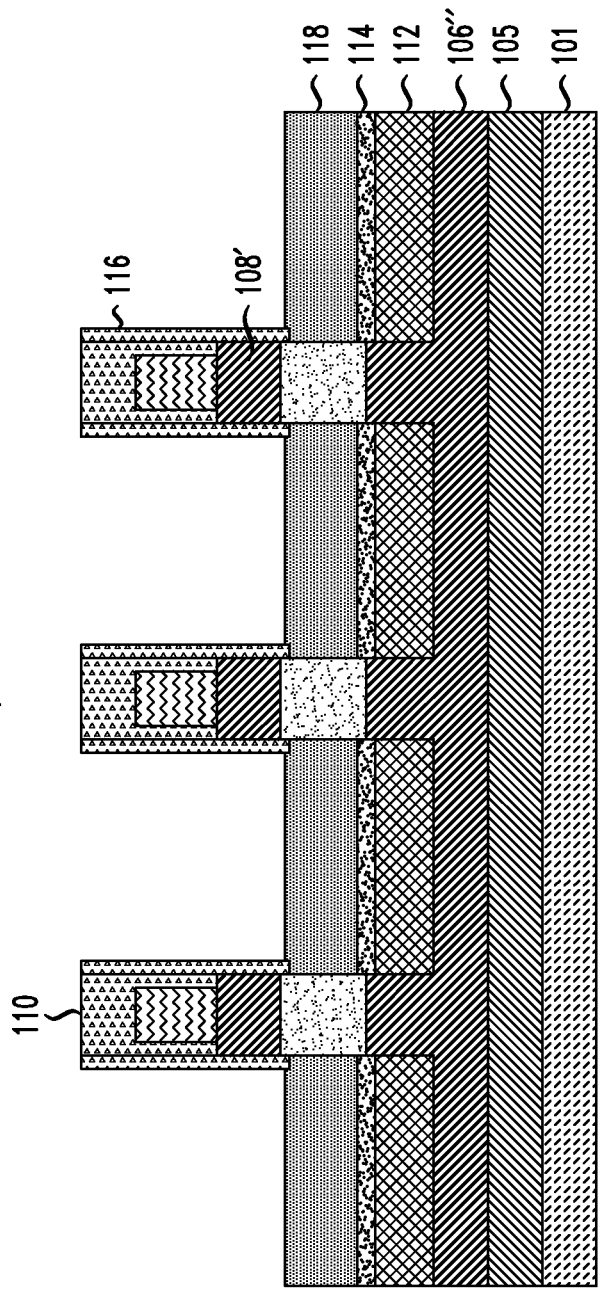
FIG. 10 is a schematic cross-sectional view taken along the line A-A or the line B-B in FIG. 11 illustrating manufacturing of a memory device and showing formation of an extrinsic base layer, according to an embodiment of the invention.
Figure 11:
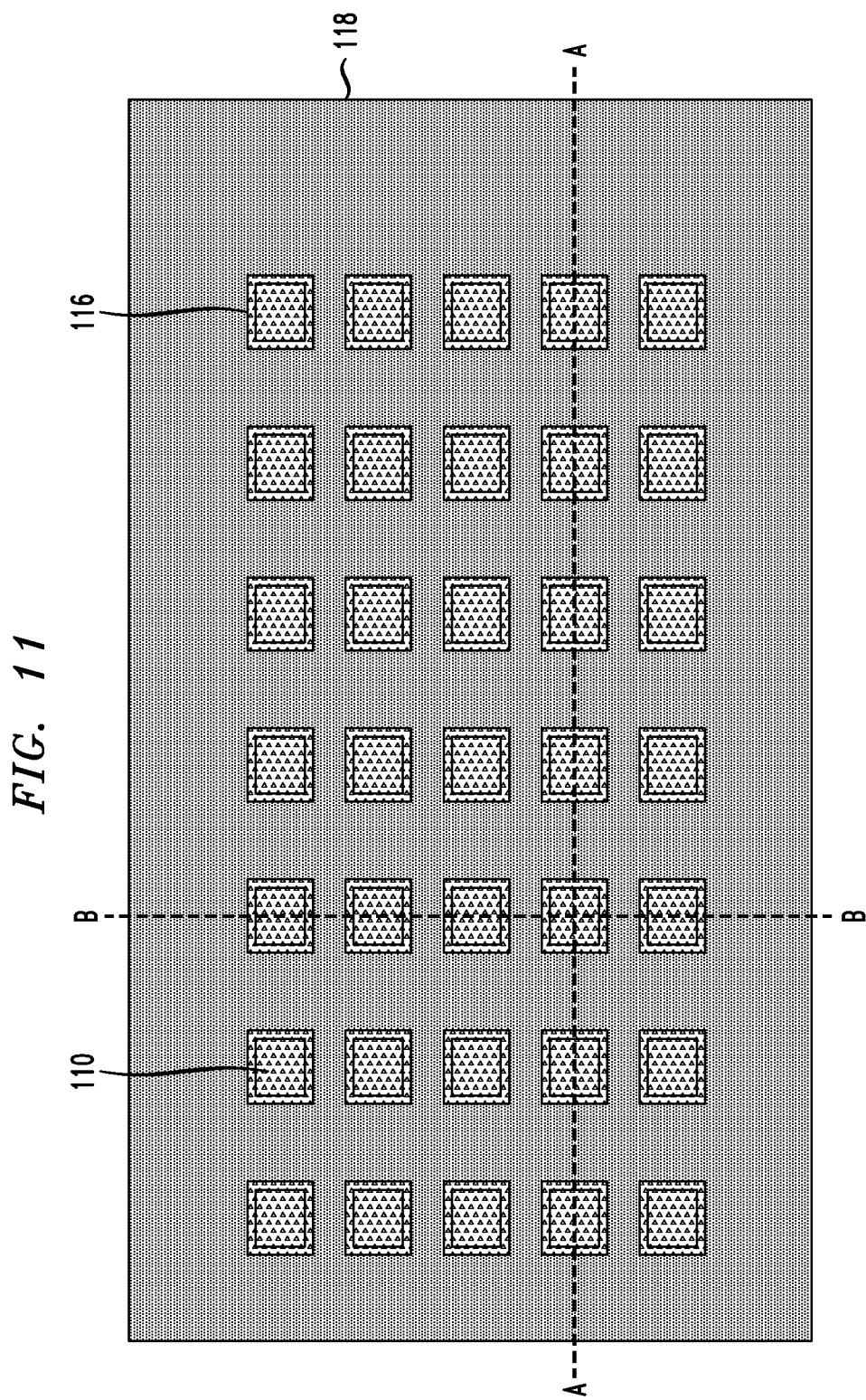
FIG. 11 is a schematic top view illustrating manufacturing of a memory device and showing formation of an extrinsic base layer, according to an embodiment of the invention.

FIG. 10 is a schematic cross-sectional view taken along either the line A-A or the line B-B in the top view of FIG. 11. Referring to FIGS. 10 and 11, an extrinsic base layer 118 is formed on the structure of FIGS. 8 and 9. The extrinsic base layer 118 is formed by a selective epitaxial growth process from the exposed sides of the base layer 107', and has the same doping type/polarity (e.g., p) as the base layer 107', but is doped at a higher concentration than the base layers 107' (e.g., p$^+$). According to an embodiment, a p+ doped extrinsic base layer 118 is doped with, for example, boron (B) at a total (i.e. active and/or inactive) concentration in the general range of $10^{20}$/cm$^3$-$10^{21}$/cm$^3$. According to an embodiment, the extrinsic base layer 118 has a wider band gap than that of the base layer 107'. The extrinsic base layer 118 may comprise the same material (e.g., SiGe) as that of the base layer 107', or another material, such as, for example, silicon.

A vertical height of the extrinsic base layer 118 with respect to the underlying layer (e.g., spacer layer 114) on which the extrinsic base layer 118 is formed is about 5 nm-about 20 nm, but a thinner or thicker layer may be used as well. According to an embodiment, the extrinsic base layer 118 covers exposed sides of the base layers 107' and is formed on the spacer layer 114. The extrinsic base layer 118 may also be formed on lower end portions of the hanging spacer layers 116.

Figure 12:
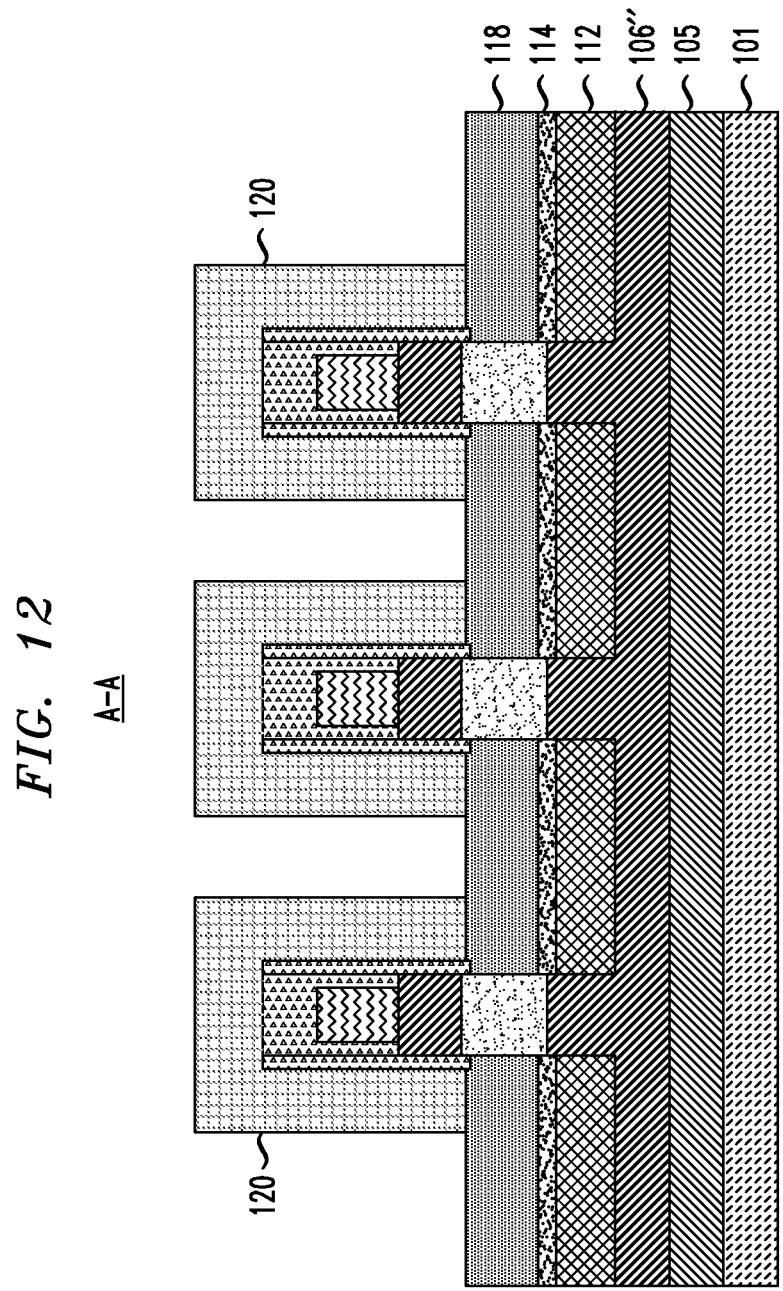
FIG. 12 is a schematic cross-sectional view taken along the line A-A in FIG. 14 illustrating manufacturing of a memory device and showing formation of extrinsic base masks, according to an embodiment of the invention.
Figure 13:
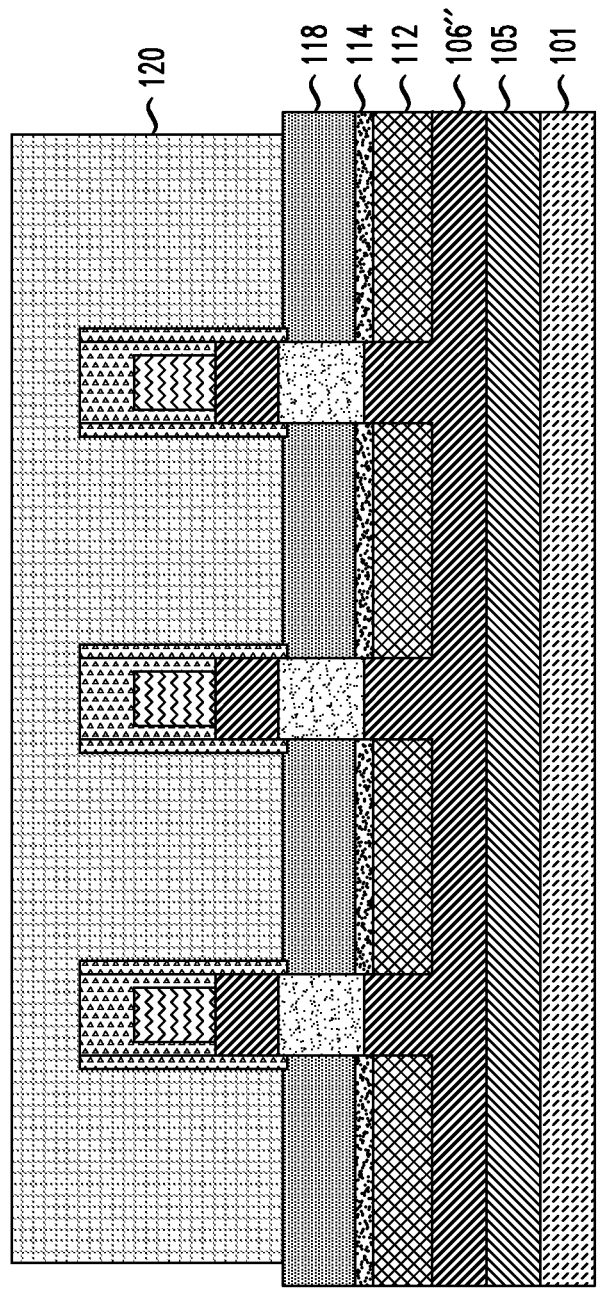
FIG. 13 is a schematic cross-sectional view taken along the line B-B in FIG. 14 illustrating manufacturing of a memory device and showing formation of an extrinsic base mask, according to an embodiment of the invention.
Figure 14:
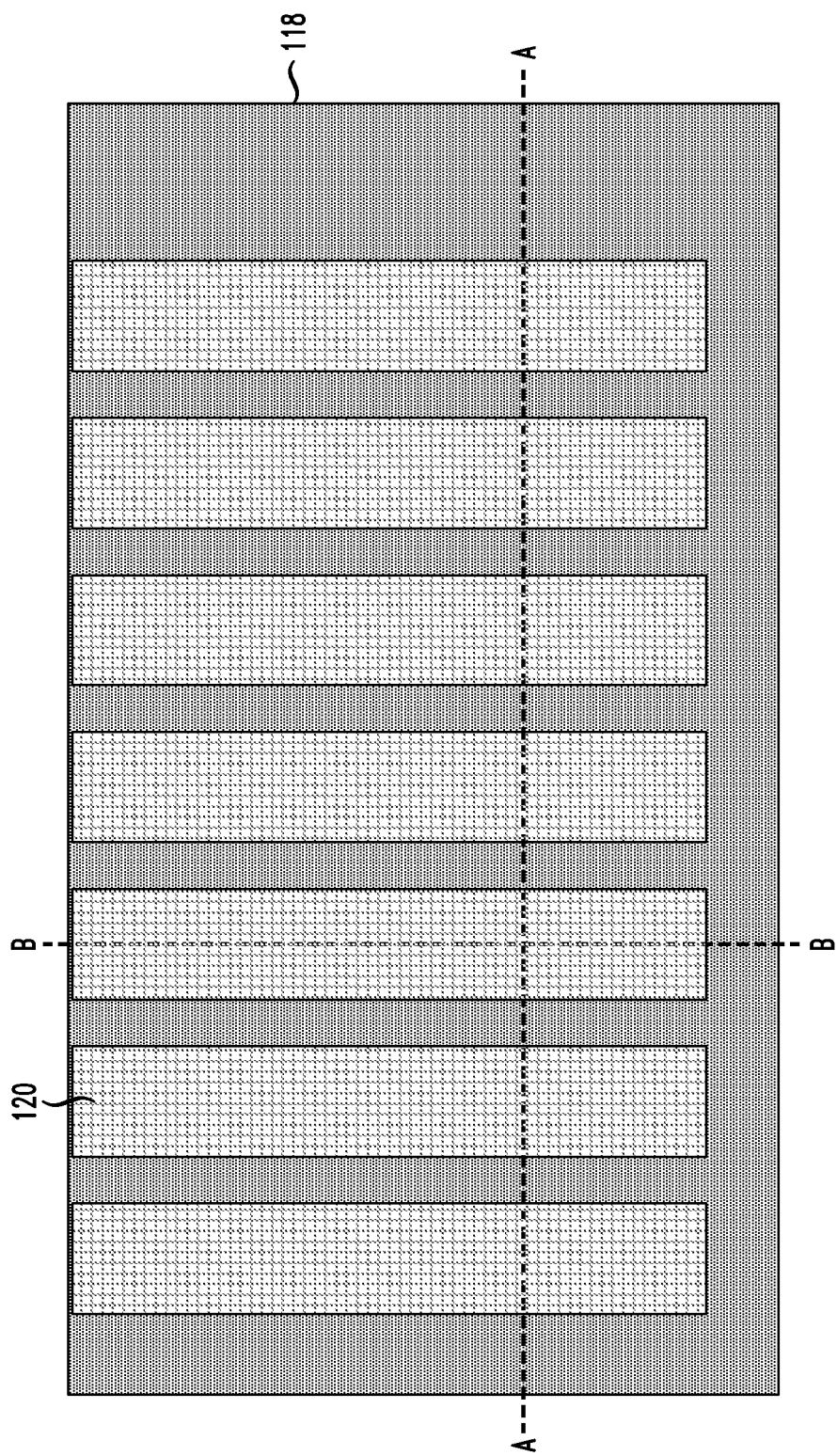
FIG. 14 is a schematic top view illustrating manufacturing of a memory device and showing formation of extrinsic base masks, according to an embodiment of the invention.

FIGS. 12 and 13 are schematic cross-sectional views taken along the line A-A and the line B-B, respectively in the top view of FIG. 14. Referring to FIGS. 12-14, extrinsic base masks 120 are formed on the pillars including the memory elements 109' and the collector layers 108', on the cap layers 110 and the hanging spacers 116, and on portions of the extrinsic base layer 118 adjacent the pillars. The masks 120 cover the portions of the extrinsic base layer 118 adjacent the pillars, and leave exposed remaining portions of the extrinsic base layer 118. The masks 120 can be deposited using, for example CVD, PECVD, RFCVD, HWCVD, PVD, ALD, MLD, MBD, PLD, LSMCD, and/or sputtering. According to one or more embodiments, the masks 120 are hardmasks comprising a dielectric material, such as, but not necessarily limited to, SiN or SiO.

Figure 15:
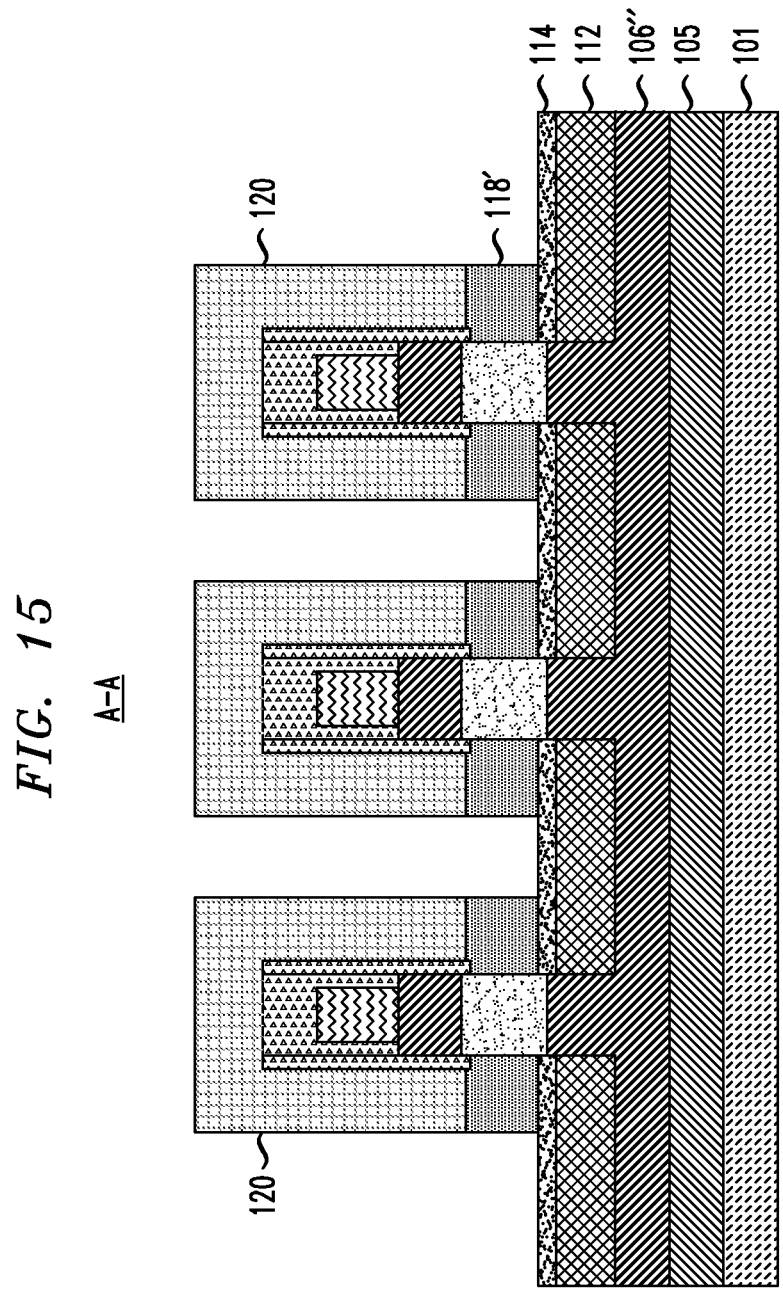
FIG. 15 is a schematic cross-sectional view taken along the line A-A in FIG. 17 illustrating manufacturing of a memory device and showing removal of exposed portions of the extrinsic base layer, according to an embodiment of the invention.
Figure 16:
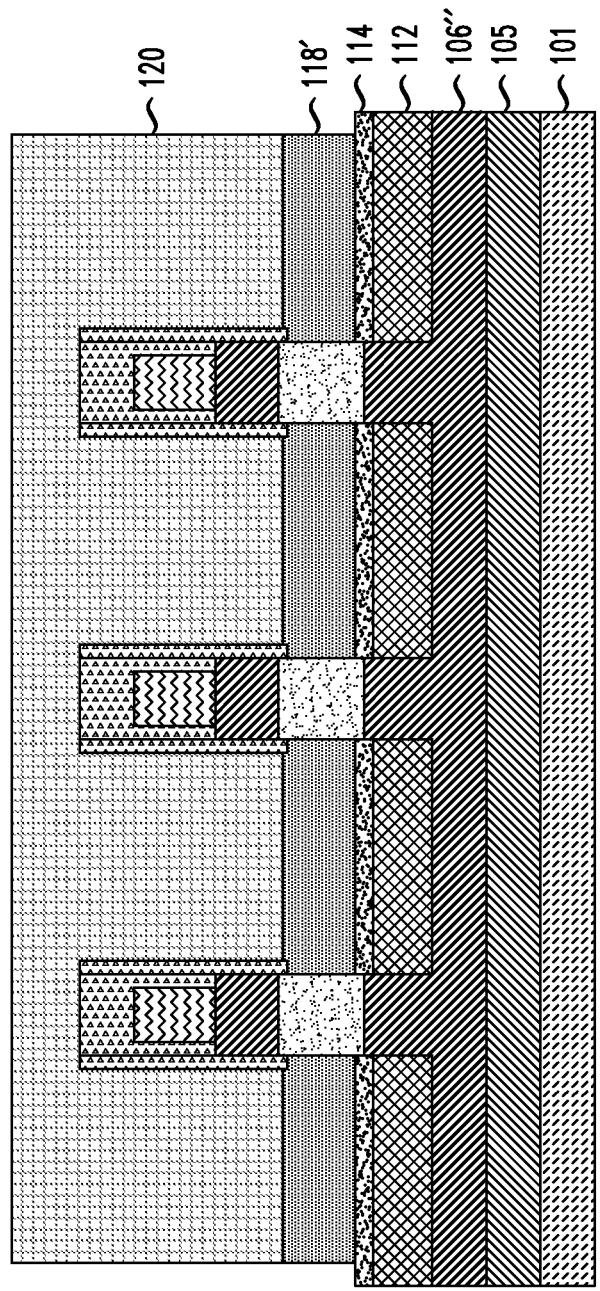
FIG. 16 is a schematic cross-sectional view taken along the line B-B in FIG. 17 illustrating manufacturing of a memory device and showing removal of exposed portions of the extrinsic base layer, according to an embodiment of the invention.
Figure 17:
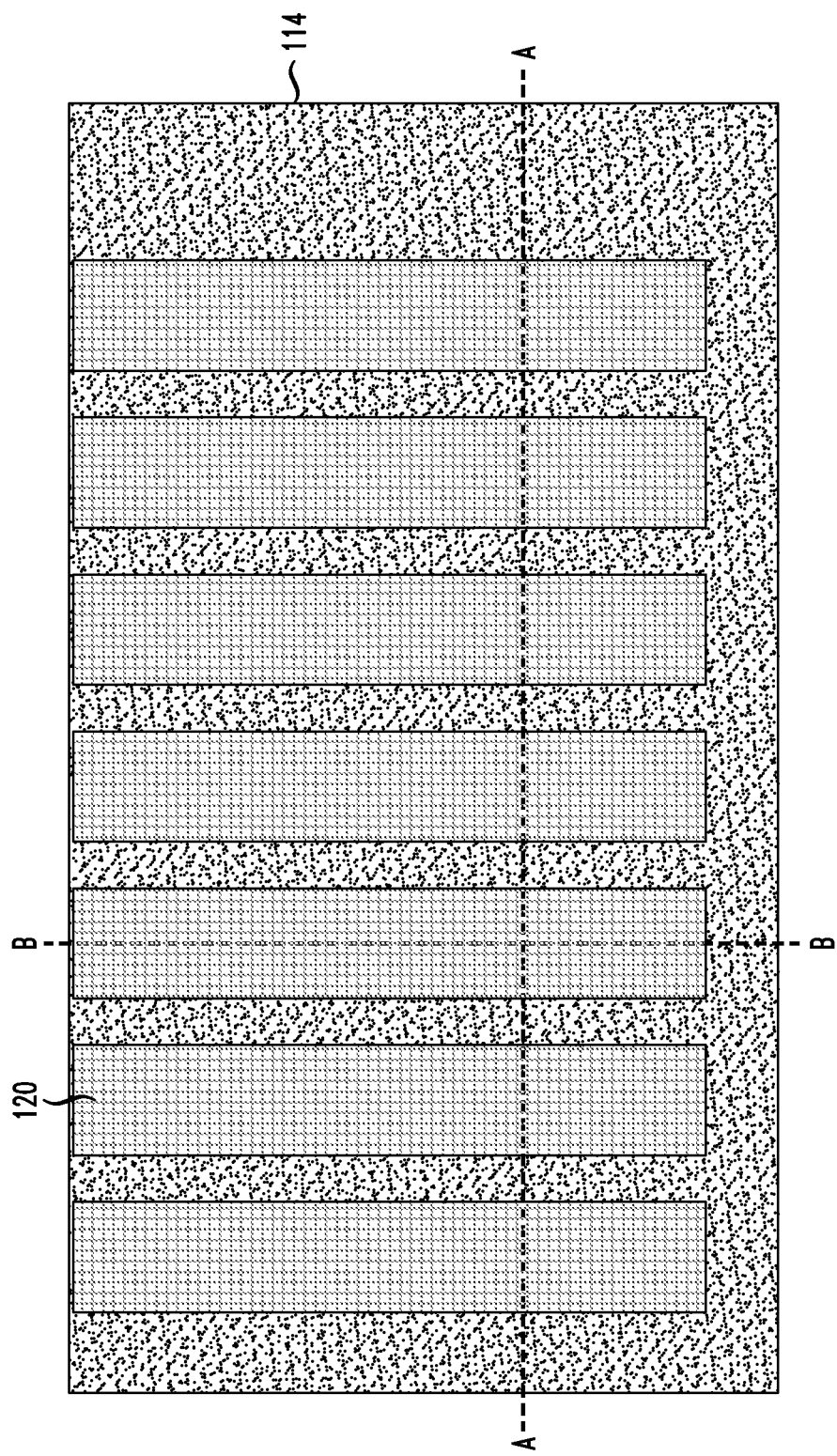
FIG. 17 is a schematic top view illustrating manufacturing of a memory device and showing removal of exposed portions of the extrinsic base layer, according to an embodiment of the invention.

FIGS. 15 and 16 are schematic cross-sectional views taken along the line A-A and the line B-B, respectively in the top view of FIG. 17. Referring to FIGS. 15-17, exposed portions of the extrinsic base layer 118 not covered by the masks 120 are removed using, for example, an etching process. According to an embodiment, the removal process is a RIE process using, for example, SF$_6$/CHF$_3$ plasma or CF$_4$ plasma, which removes the exposed portions of the extrinsic base layer 118, and exposes the underlying portions of the spacer layer 114. The remaining patterned portions of the extrinsic base layer 118' are under the masks 120. Referring to FIGS. 16 and 17, the patterned portions of the extrinsic base layer 118' electrically connect multiple pillars including memory elements 109' and BJT devices along the vertical direction in FIG. 17 (e.g., line B-B). Referring to FIGS. 15 and 17, where there are breaks in the patterned portions of the extrinsic base layer 118', the patterned portions of the extrinsic base layer 118' do not electrically connect the pillars along the horizontal direction in FIG. 17 (e.g., line A-A).

Figure 18:
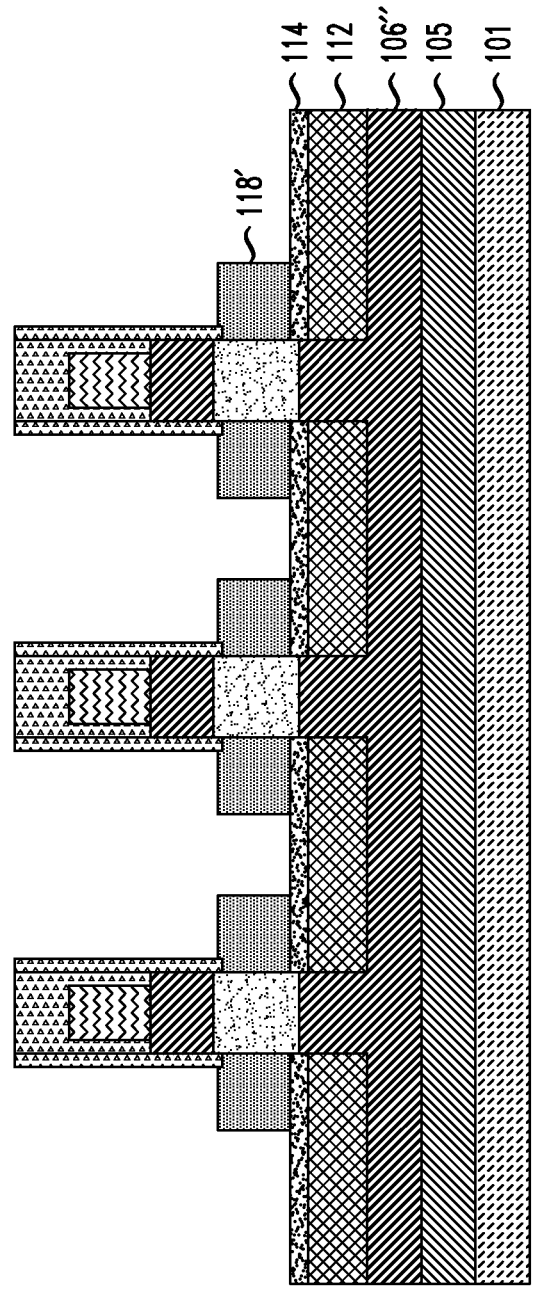
FIG. 18 is a schematic cross-sectional view taken along the line A-A in FIG. 20 illustrating manufacturing of a memory device and showing mask removal, according to an embodiment of the invention.
Figure 19:
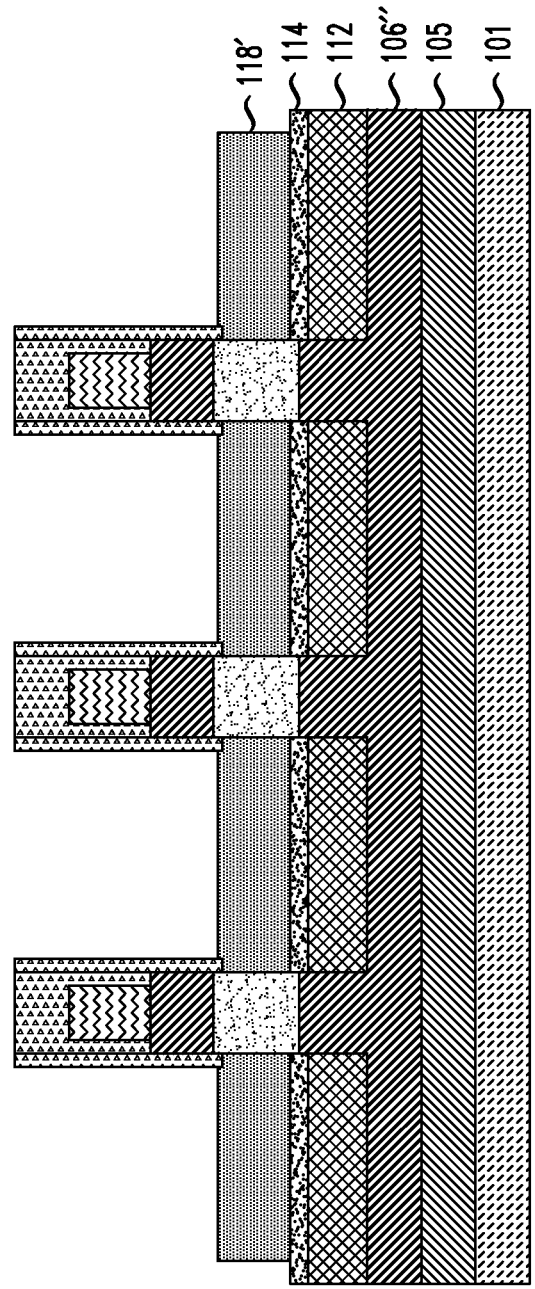
FIG. 19 is a schematic cross-sectional view taken along the line B-B in FIG. 20 illustrating manufacturing of a memory device and showing mask removal, according to an embodiment of the invention.
Figure 20:
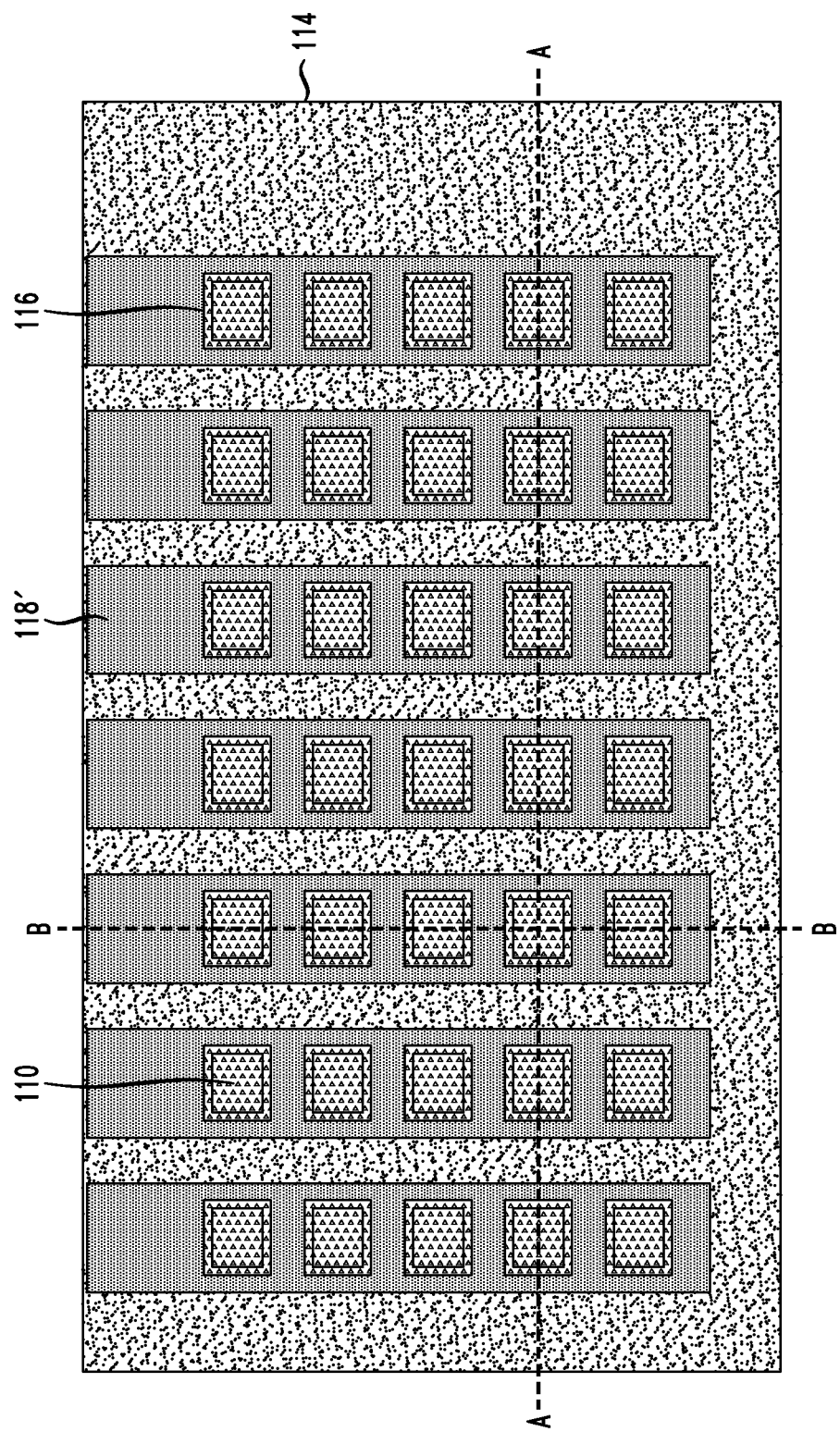
FIG. 20 is a schematic top view illustrating manufacturing of a memory device and showing mask removal, according to an embodiment of the invention.

FIGS. 18 and 19 are schematic cross-sectional views taken along the line A-A and the line B-B, respectively in the top view of FIG. 20. Referring to FIGS. 18-20, the masks 120 are removed from on top of the patterned portions of the extrinsic base layer 118', and from on top of the pillars including the cap layers 110 and the hanging spacers 116. According to an embodiment, the masks 120 are removed using a wet etch such as with buffered hydrofluoric acid or a plasma etch such as with $CF_4/O_2$. As can be seen in FIG. 20, the patterned portions of the extrinsic base layer 118' connect the pillars along the vertical direction (e.g., line B-B), but not along the horizontal direction (e.g., line A-A).

Figure 21:
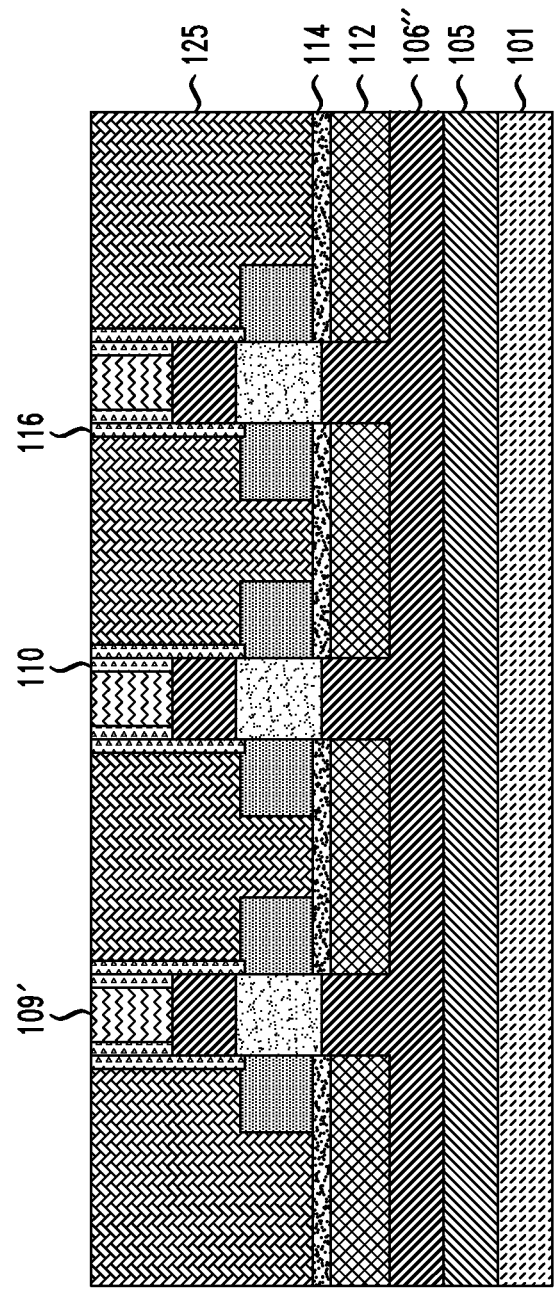
FIG. 21 is a schematic cross-sectional view taken along the line A-A in FIG. 23 illustrating manufacturing of a memory device and showing inter-layer dielectric (ILD) layer formation and planarization, according to an embodiment of the invention.
Figure 22:
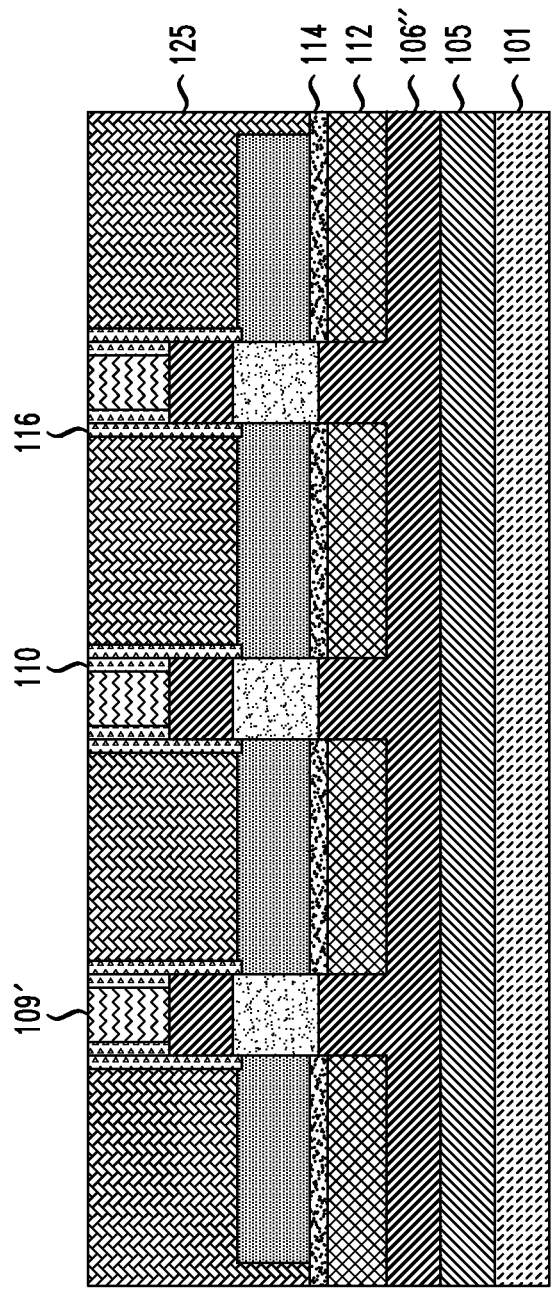
FIG. 22 is a schematic cross-sectional view taken along the line B-B in FIG. 23 illustrating manufacturing of a memory device and showing ILD layer formation and planarization, according to an embodiment of the invention.
Figure 23:
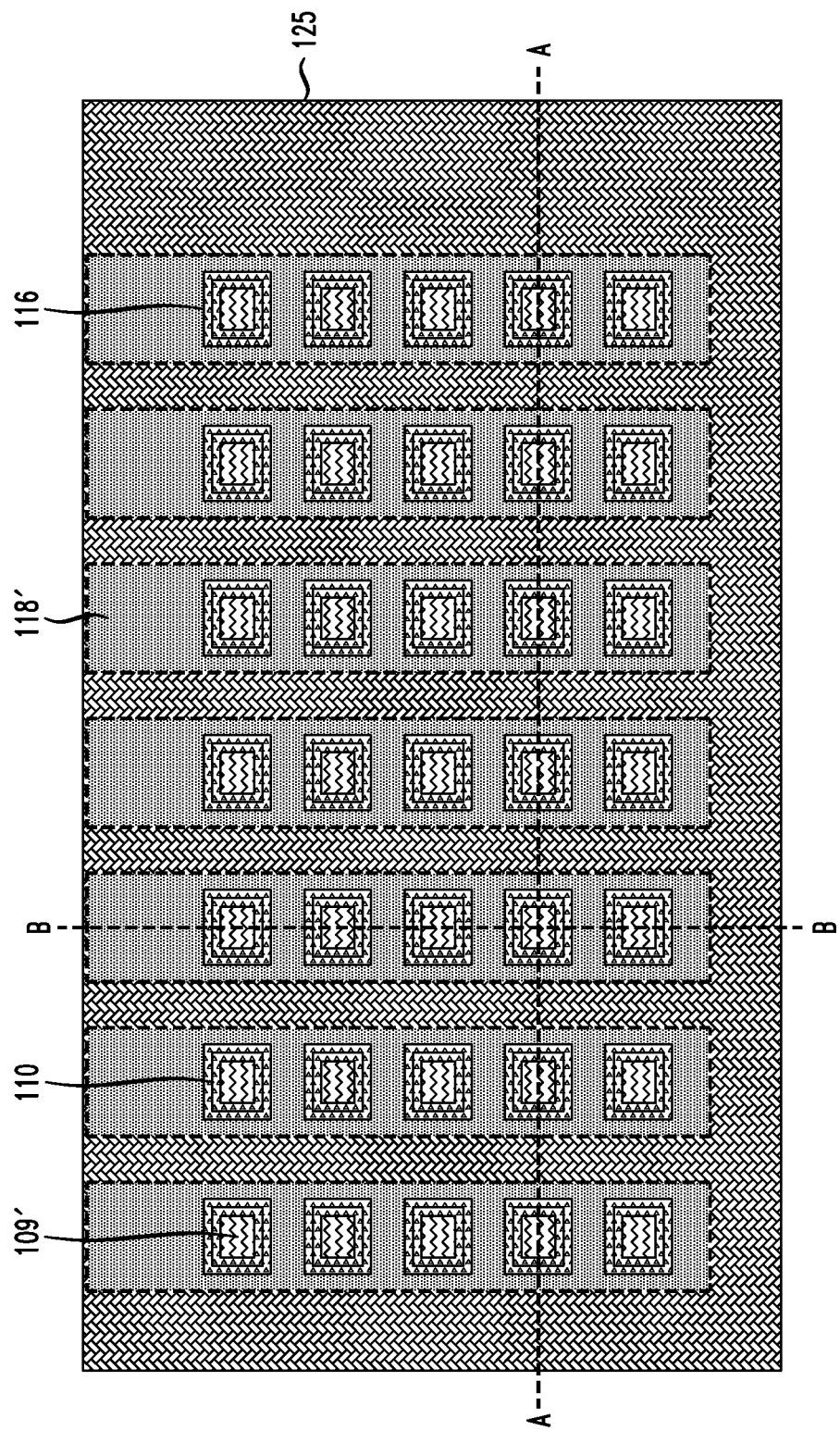
FIG. 23 is a schematic top view illustrating manufacturing of a memory device and showing ILD layer formation and planarization, according to an embodiment of the invention.

FIGS. 21 and 22 are schematic cross-sectional views taken along the line A-A and the line B-B, respectively in the top view of FIG. 23. Referring to FIGS. 21-23, an inter-layer dielectric (ILD) layer 125 is deposited on the exposed portions of the spacer layer 114, the patterned portions of the extrinsic base layer 118' and on and around the pillars including the cap layers 110, hanging spacers 116, memory elements 109' and underlying BJT layers 108'. 107' and 106'. The ILD layer 125 fills in areas on the spacer layer 114 and patterned extrinsic base layers 118' between the pillars. The material of the ILD layer 125 can include, but is not necessarily limited to, a low-K dielectric material, such as, for example, silicon oxide, SiN, SiON, BN, and/or SiBN. The dielectric layer 125 is deposited using deposition techniques such as, for example, CVD, PECVD, RFCVD, PVD, ALD, MBD, PLD, LSMCD, and/or sputtering, which is followed by a planarization process, such as, CMP, down to the memory elements 109', exposing the top surfaces of the memory elements 109'. The planarization removes upper portions of the cap layers 110, portions of the hanging spacers 145 on the upper portions of the cap layers 110, and excess portions of the ILD layer 125 to result in the structure shown in FIGS. 21-23. In FIG. 23, the patterned portions of the extrinsic base layer 118' are outlined in dotted lines to illustrate the presence of the patterned portions of the extrinsic base layer 118' under the ILD layer 125. In general, in the top views, elements outlined by dotted lines are hidden by overlying layers.

Figure 24:
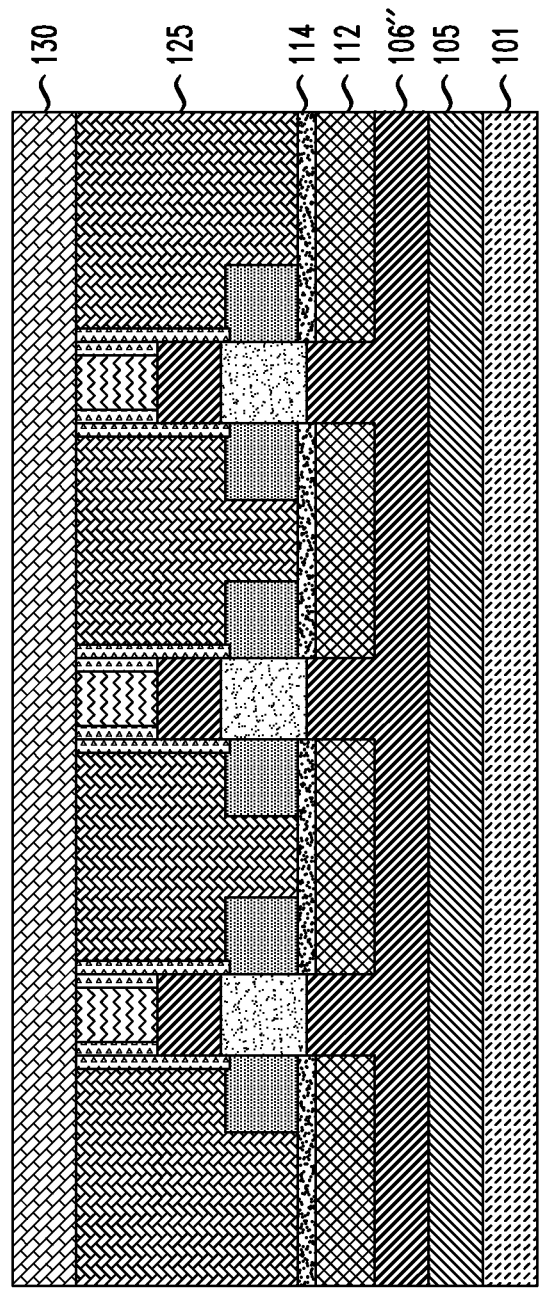
FIG. 24 is a schematic cross-sectional view taken along the line A-A in FIG. 26 illustrating manufacturing of a memory device and showing top conductive crossbar formation, according to an embodiment of the invention.
Figure 25:
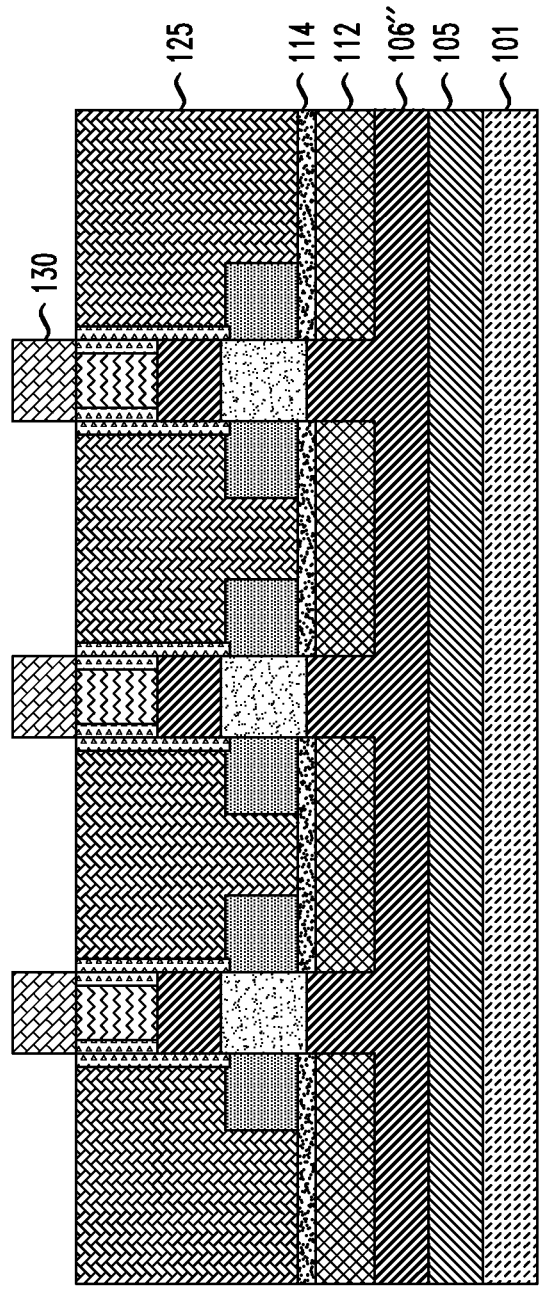
FIG. 25 is a schematic cross-sectional view taken along the line B-B in FIG. 26 illustrating manufacturing of a memory device and showing top conductive crossbar formation, according to an embodiment of the invention.
Figure 26:
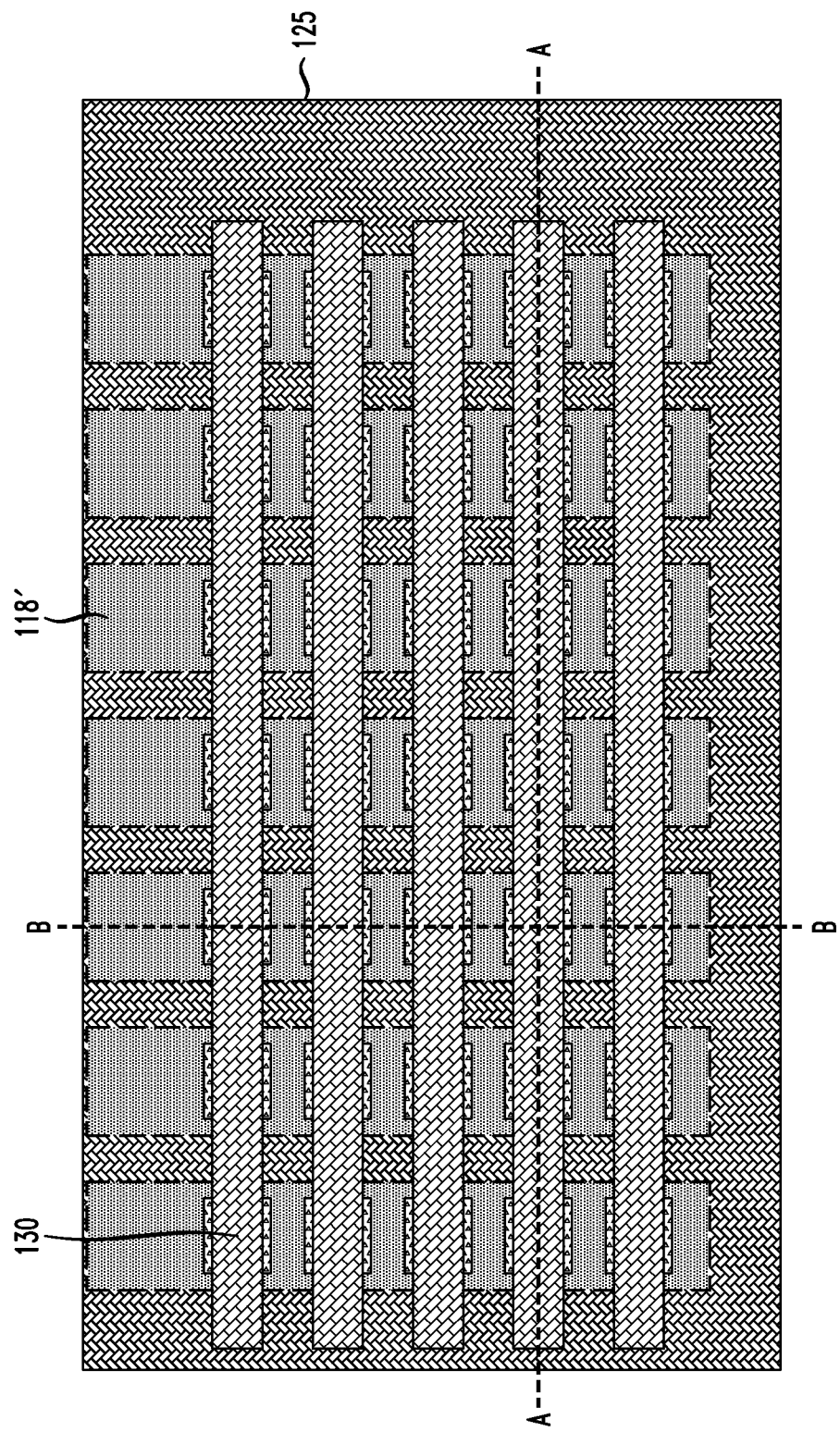
FIG. 26 is a schematic top view illustrating manufacturing of a memory device and showing top conductive crossbar formation, according to an embodiment of the invention.

FIGS. 24 and 25 are schematic cross-sectional views taken along the line A-A and the line B-B, respectively in the top view of FIG. 26. Referring to FIGS. 24-26, top conductive crossbars (also referred to herein as "bitlines") are formed on the structure of FIGS. 21-23 to contact the memory elements 109'. A plurality of bitlines 130 are formed on the ILD layer 125 to be spaced apart from each other in positions corresponding to the pillars including layers 109', 108' and 106'. The bitlines 130 physically and electrically contact their corresponding memory elements 109'.

As can be seen in the top view of FIG. 26, the bitlines 130 are oriented to have a length (longer dimension) extension direction in the horizontal direction in FIG. 26. In order to form a cross-point memory structure, the plurality of bitlines are perpendicular to the plurality of wordlines. In this case, the wordlines are the extrinsic base layer portions 118', which have a length (longer dimension) extension direction in the vertical direction in FIG. 26.

The material of the bitlines 130 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bitlines 130 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bitline layer is deposited and then patterned into individual portions that are spaced apart from each other. The bitlines 130 can be patterned to be spaced apart from each other, using, for example, photolithography and ME, which may optionally include a dielectric hard mask such as an oxide or nitride.

Figure 27:
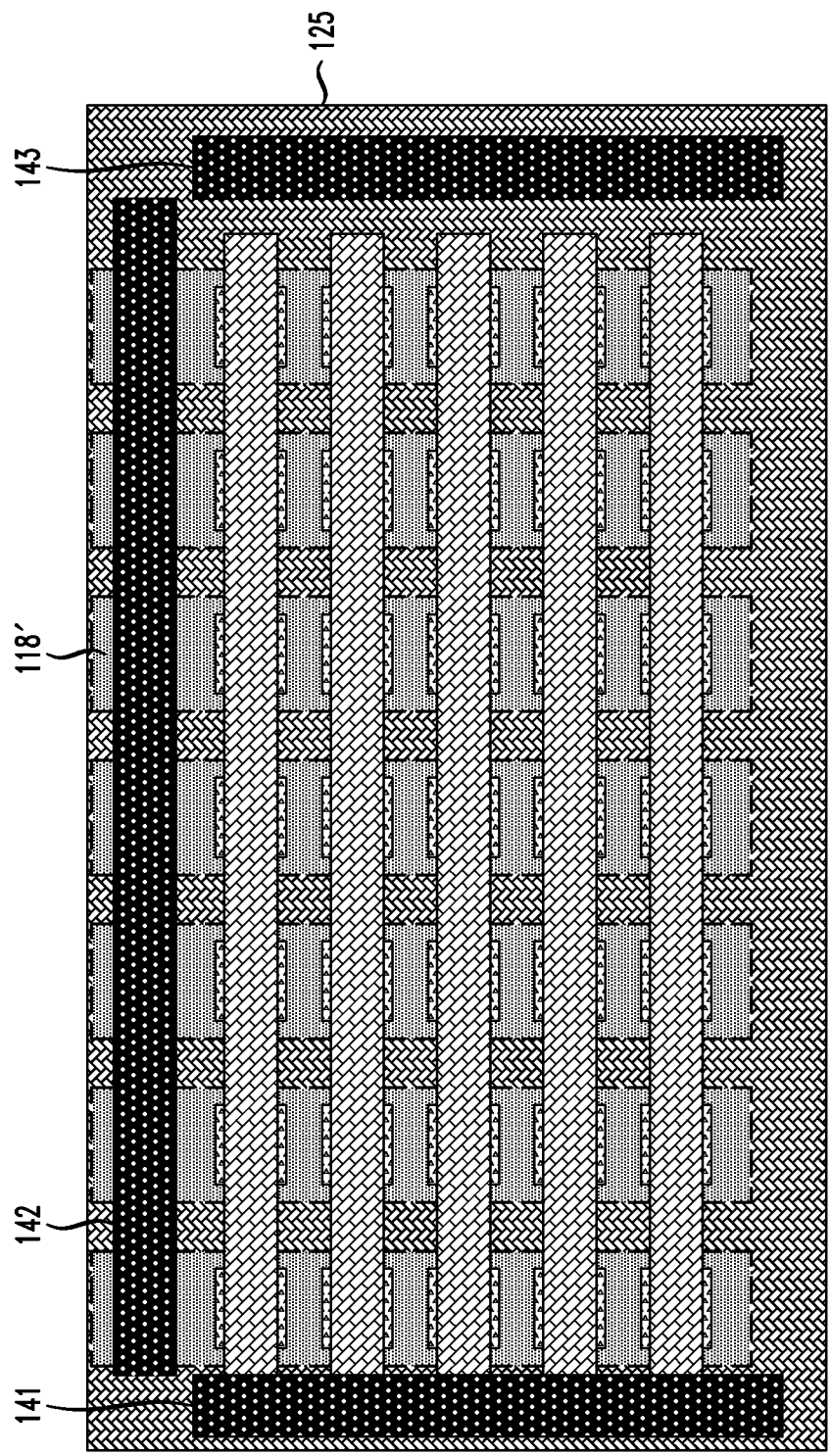
FIG. 27 is a schematic top view illustrating manufacturing of a memory device and showing formation of contacts to a common select line, individual bitlines and individual wordlines, according to an embodiment of the invention.

Referring to FIG. 27, a common select line contact region 143 having a contact to the common select line 106", an individual bit-line contact region 141 with contacts to respective individual bitlines 130 and an individual extrinsic base access contact region 142 with contacts to respective individual wordlines (e.g., extrinsic base layer portions 118') are formed. In embodiments comprised of a plurality of select lines (not shown) instead of a common select line 106", an individual select line contact region is formed similarly to common select line contact region 143, except with contacts to respective individual select lines. The contacts may be formed in trenches in a dielectric layer by filling the trenches with contact material, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trenches before filling the trenches with the contact material layers. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Figure 28:
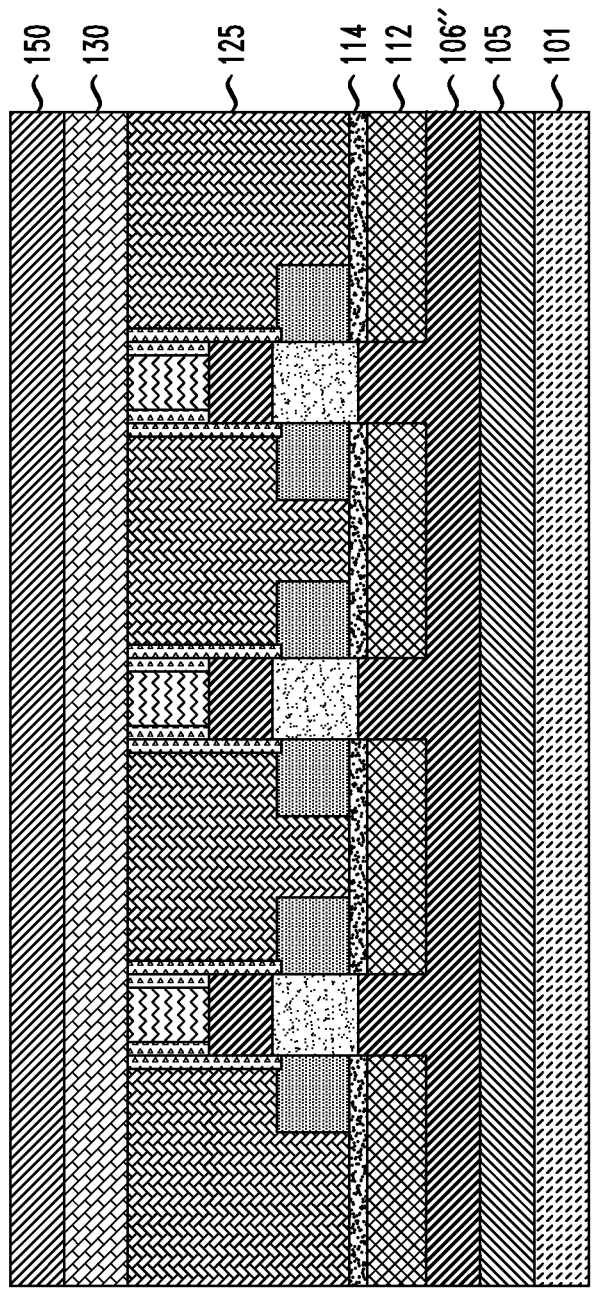
FIG. 28 is a schematic cross-sectional views illustrating manufacturing of a memory device and showing formation of a dielectric layer and planarization, according to an embodiment of the invention.
Figure 29:
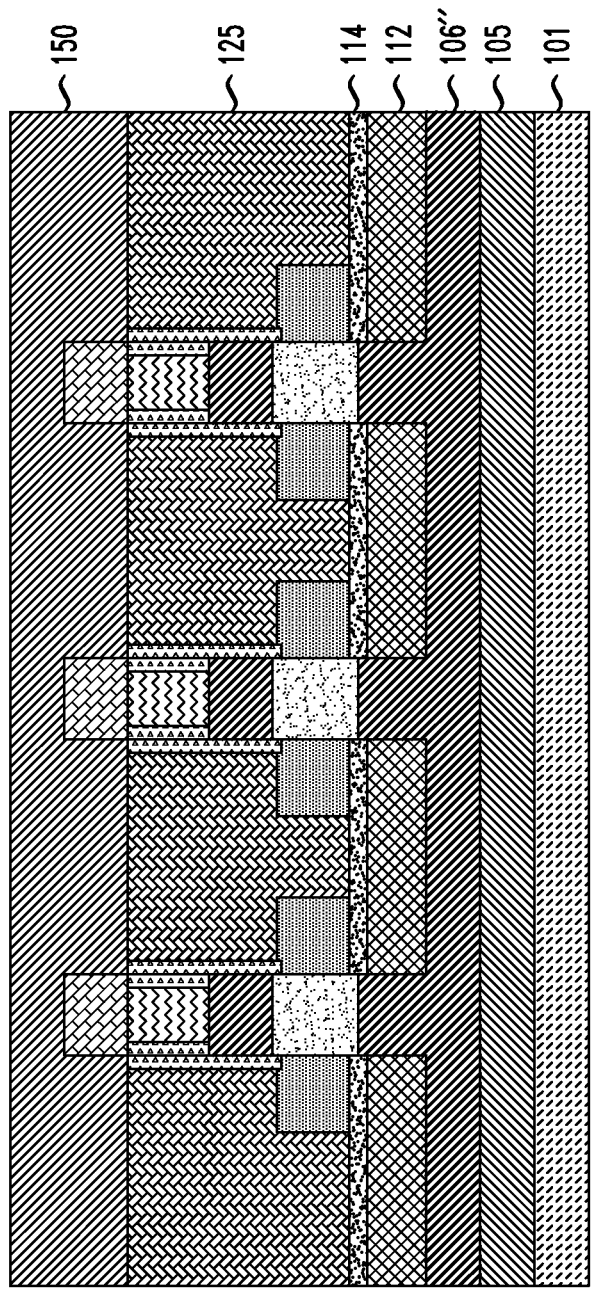
FIG. 29 is a schematic cross-sectional view illustrating manufacturing of a memory device and showing formation of a dielectric layer and planarization, according to an embodiment of the invention.

Referring to FIGS. 28 and 29, following formation of the contact regions 141, 142 and 143, another ILD layer 150 is deposited on the bitlines 130 to fill in areas between the bitlines 130. The material of the ILD layer 150 can include, but is not necessarily limited to, the same or similar material as that of the ILD layer 125, and can be deposited using the same or similar deposition techniques as those for the ILD layer 150, which is followed by a planarization process, such as, CMP. The cross-sections in FIGS. 28 and 29 are respectively taken along horizontal and vertical directions (similar to lines A-A and B-B) of a top view (not shown).

Figure 30:
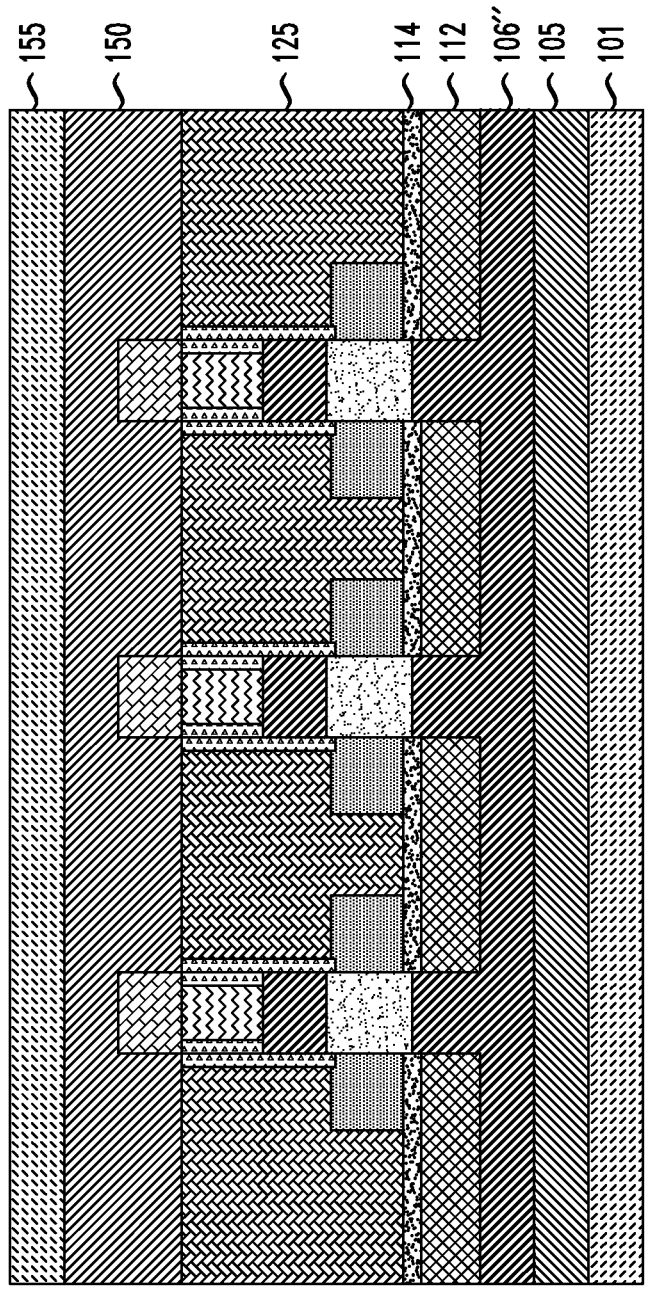
FIG. 30 is a schematic cross-sectional view illustrating manufacturing of a memory device and showing bonding of a cross-point array to a temporary handle substrate, according to an embodiment of the invention.

Referring to FIG. 30, the structure from FIGS. 28 and 29 is bonded to a temporary handle substrate 155 at a top surface of the ILD layer 150. According to an embodiment, an adhesive and/or release layer (not shown) is utilized between handle substrate 155 and the ILD layer 150. The handle substrate 155 can be formed of the same or similar material as that of the carrier substrate 101. The cross-section in FIG. 30 is taken along a vertical direction (similar to line B-B) of a top view (not shown).

Figure 31:
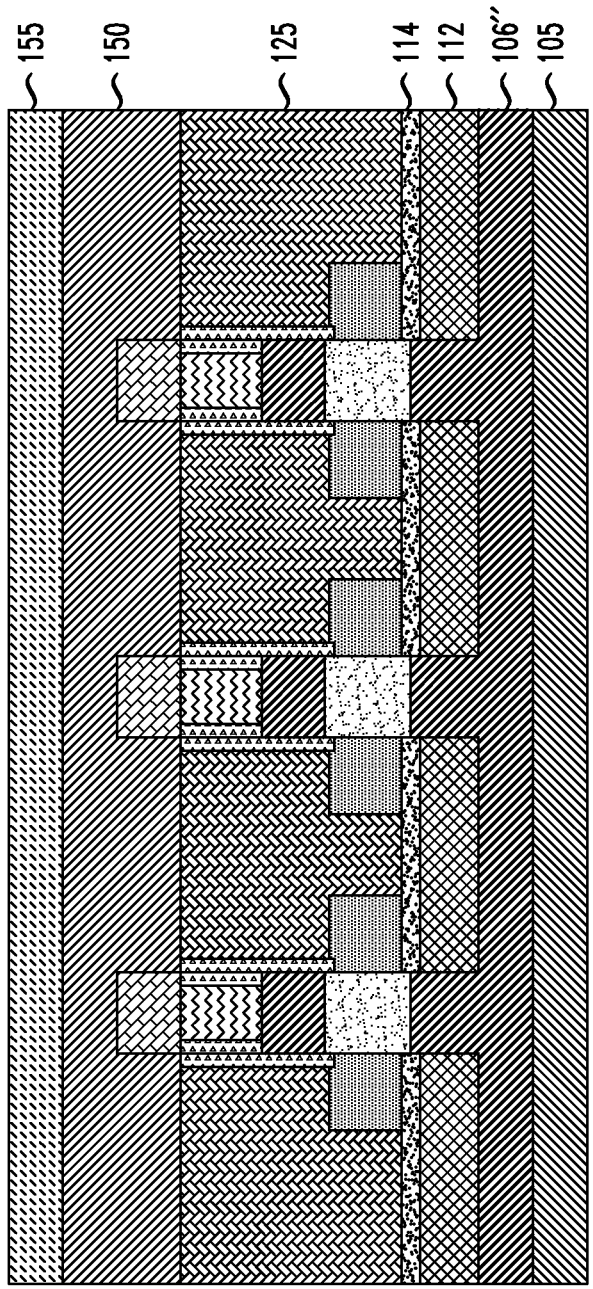
FIG. 31 is a schematic cross-sectional view illustrating manufacturing of a memory device and showing removal of a carrier substrate from a cross-point array, according to an embodiment of the invention.

Referring to FIG. 31, following bonding to the temporary handle substrate 155, the carrier substrate 101 is removed from the structure of FIG. 30 using one or more techniques, such as, for example, CMP, followed by a selective etch (e.g., with tetramethylammonium hydroxide (TMAH)). The selective etch stops on the dielectric layer 105.

Figure 32:
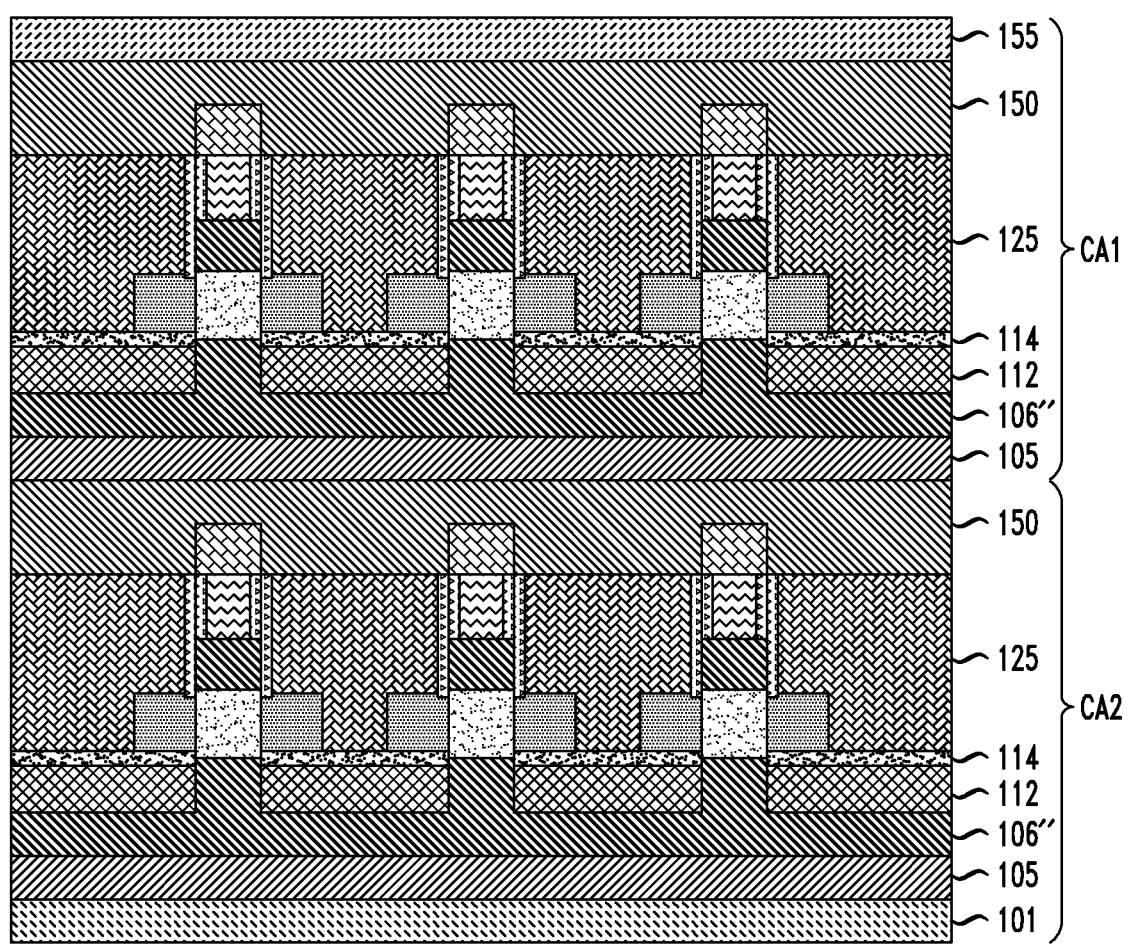
FIG. 32 is a schematic cross-sectional view illustrating manufacturing of a memory device and showing bonding of two cross-point arrays, according to an embodiment of the invention.

Referring to FIG. 32, two cross-point arrays CA1 and CA2 are bonded to each other. For example, the first cross-point array CA1 is the device of FIG. 31 including the temporary handle substrate 155, where the carrier substrate 101 has been removed. The second cross-point array CA2 is the device of FIG. 29, which does not include the temporary handle substrate 155 and includes the carrier substrate 101. In order to form a stacked structure of multiple cross-point arrays, the first and second cross-point arrays CA1 and CA2 are bonded to each other using, for example, dielectric-to-dielectric bonding. Including, but not limited to, thermal and/or plasma assisted bonding. As can be understood from FIG. 32, bonding between the two cross-point arrays CA1 and CA2 is between the ILD layer 150 of cross-point array CA2 and the dielectric layer 105 of cross-point array CA1.

Figure 33:
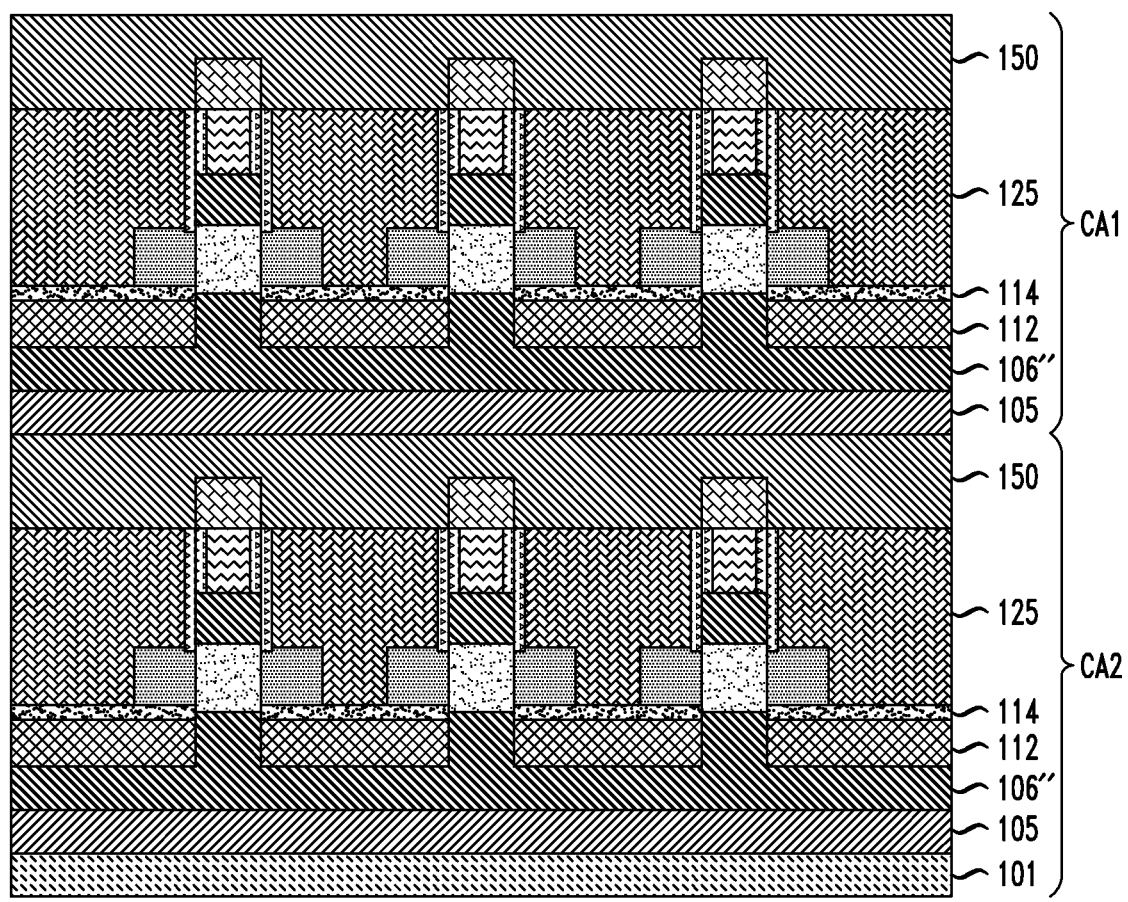
FIG. 33 is a schematic cross-sectional view illustrating manufacturing of a memory device and showing removal of a temporary handle substrate from an upper cross-point array, according to an embodiment of the invention.

Referring to FIG. 33, following bonding between the cross-point arrays CA1 and CA2, the temporary handle substrate 155 is removed from the cross-point array CA1 using one or more techniques, such as, for example, CMP, followed by a selective etch (e.g., with TMAH). The selective etch stops on the ILD layer 150.

Although two stacked cross-point arrays CA1 and CA2 are shown, the embodiments are not necessarily limited thereto. For example, more than two cross-point arrays may be stacked on each other. For example, after removal of the temporary handle substrate 155 as described in connection with FIG. 33, another cross-point array having the same or similar structure to the cross-point array CA1 in FIG. 32 can be bonded to the top of the structure of FIG. 33 on top of the ILD layer 150 of the cross-point array CA1. The bonding would be the same or similar to that described in connection with FIG. 32. In this way, three cross-point arrays may be stacked on each other. This process may be continued for more than three stacked cross-point arrays.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
    forming a plurality of doped semiconductor layers in a stacked configuration on a dielectric layer, wherein the plurality of doped semiconductor layers each comprise a single crystalline semiconductor material;
    forming a memory stack layer on an uppermost doped semiconductor layer of the plurality of doped semiconductor layers; and
    patterning the memory stack layer and a plurality of doped semiconductor layers into a plurality of pillars spaced apart from each other;
        wherein the patterned plurality of doped semiconductor layers in each pillar of the plurality of pillars are components of a bipolar junction transistor device;
        wherein the plurality of pillars are parts of a memory cell array having a cross-point structure;
        wherein the patterned plurality of doped semiconductor layers in each pillar comprise a first single crystalline layer, a second single crystalline layer stacked on the first single crystalline layer, and a third single crystalline layer stacked on the second single crystalline layer;
        wherein the first and third single crystalline layers in each pillar have a first doping type; and
        wherein the second single crystalline layer in each pillar has a second doping type different from the first doping type; and
    growing a plurality of extrinsic base layers from the second single crystalline layers.

2. The method according to claim 1, wherein the plurality of extrinsic base layers have the second doping type and are doped at a higher concentration than the second single crystalline layers.

3. The method according to claim 1, wherein respective ones of the plurality of extrinsic base layers connect a group of the plurality of pillars along a first direction.

4. The method according to claim 3, further comprising forming a plurality of bitlines extending perpendicular to the first direction, wherein the plurality of bitlines contact the patterned portions of the memory stack layer in each pillar.

5. The method according to claim 1, wherein the patterning the plurality of doped semiconductor layers comprises:
    forming an upper portion of a bottom layer of the plurality of doped semiconductor layers into a lowermost layer of the patterned plurality of doped semiconductor layers in each pillar; and
    forming a lower portion of the bottom layer of the plurality of doped semiconductor layers into one of a common select line and a plurality of select lines.

6. The method according to claim 1, further comprising bonding the memory cell array having the cross-point structure to a second memory cell array having a second cross-point structure.

7. The method according to claim 6, wherein the second memory cell array comprises:
    a plurality of second pillars each comprising a memory element and a plurality of doped single crystalline semiconductor layers in a stacked configuration;
    wherein the plurality of doped single crystalline semiconductor layers in each pillar of the plurality of second pillars are components of a bipolar junction transistor device.

8. The method according to claim 6, further comprising:
    forming an inter-layer dielectric layer over the plurality of pillars;
    forming a handle substrate on the inter-layer dielectric layer.

9. A method for manufacturing a semiconductor memory device, comprising:
    forming a plurality of doped semiconductor layers in a stacked configuration on a dielectric layer, wherein the plurality of doped semiconductor layers each comprise a single crystalline semiconductor material;
    forming a memory stack layer on an uppermost doped semiconductor layer of the plurality of doped semiconductor layers; and
    patterning the memory stack layer and a plurality of doped semiconductor layers into a plurality of pillars spaced apart from each other;
        wherein the patterned plurality of doped semiconductor layers in each pillar of the plurality of pillars are components of a bipolar junction transistor device; and
        wherein the plurality of pillars are parts of a memory cell array having a cross-point structure;
    bonding the memory cell array having the cross-point structure to a second memory cell array having a second cross-point structure;
        wherein the second memory cell array comprises:
            a plurality of second pillars each comprising a memory element and a plurality of doped single crystalline semiconductor layers in a stacked configuration;
            wherein the plurality of doped single crystalline semiconductor layers in each pillar of the plurality of second pillars are components of a bipolar junction transistor device wherein the bonding comprises:
bonding the dielectric layer to an inter-layer dielectric layer formed over the plurality of second pillars of the second memory cell array.

10. A semiconductor device comprising:
a plurality of stacked structures spaced apart from each other and formed on one of a common select line and a plurality of select lines;
wherein each of the plurality of stacked structures comprises:
a first single crystalline semiconductor layer on one of the common select line and a select line of the plurality of select lines;
a second single crystalline semiconductor layer stacked on the first single crystalline semiconductor layer;
a third single semiconductor crystalline layer stacked on the second single crystalline semiconductor layer; and
a memory element stacked on the third single crystalline semiconductor layer;
wherein the first, second and third single crystalline semiconductor layers in each stacked structure of the plurality of stacked structures are components of a bipolar junction transistor device;
wherein the plurality of stacked structures are parts of a memory cell array having a cross-point structure;
wherein a plurality of extrinsic base layers extend from the second single crystalline semiconductor layers; and
wherein the plurality of extrinsic base layers have the same doping type as the second single crystalline semiconductor layers and are doped at a higher concentration than the second single crystalline semiconductor layers.

11. The semiconductor device of claim 10, wherein:
the first and third single crystalline semiconductor layers in each stacked structure have a first doping type; and
the second single crystalline semiconductor layer in each stacked structure has a second doping type different from the first doping type.

12. The semiconductor device according to claim 10, wherein respective ones of the plurality of extrinsic base layers connect a group of the plurality of stacked structures along a first direction.

13. The semiconductor device according to claim 12, further comprising a plurality of bitlines contacting the memory elements of the plurality of stacked structures, wherein the plurality of bitlines extend perpendicular to the first direction.

14. The semiconductor device according to claim 10, further comprising a second memory cell array having a second cross-point structure bonded to the memory cell array having the cross-point structure.

15. The semiconductor device according to claim 14, wherein the second memory cell array comprises:
a plurality of second stacked structures each comprising a memory element and a plurality of doped single crystalline semiconductor layers in a stacked configuration;
wherein the plurality of doped single crystalline semiconductor layers in each stacked structures of the plurality of second stacked structures are components of a bipolar junction transistor device.

16. The method according to claim 15 further comprising bonding a second selector device to the selector device.

17. The method according to claim 15, further comprising:
forming an inter-layer dielectric layer over the plurality of pillars; and
forming a handle substrate on the inter-layer dielectric layer.

18. The method according to claim 15, wherein the plurality of extrinsic base layers are doped at a higher concentration than the base layers.

19. A method for manufacturing a semiconductor memory device, comprising:
forming a plurality of doped semiconductor layers in a stacked configuration on a dielectric layer, wherein the plurality of doped semiconductor layers each comprise a single crystalline semiconductor material;
forming a memory stack layer on an uppermost doped semiconductor layer of the plurality of doped semiconductor layers;
patterning the memory stack layer and a plurality of doped semiconductor layers into a plurality of pillars spaced apart from each other;
wherein the patterned plurality of doped semiconductor layers in each pillar of the plurality of pillars comprise respective emitter, base and collector layers of a selector device; and
growing a plurality of extrinsic base layers from the base layers.

20. The method according to claim 19, wherein respective ones of the plurality of extrinsic base layers connect a group of the plurality of pillars along a first direction, and wherein the method further comprises forming a plurality of bitlines extending perpendicular to the first direction.

* * * * *